(12) United States Patent
Lu

(10) Patent No.: US 11,239,174 B2
(45) Date of Patent: Feb. 1, 2022

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/728,789

(22) Filed: Dec. 27, 2019

(65) Prior Publication Data
US 2021/0202395 A1 Jul. 1, 2021

(51) Int. Cl.
| | |
|---|---|
| *H01L 25/18* | (2006.01) |
| *H01L 23/538* | (2006.01) |
| *H01L 23/00* | (2006.01) |
| *H01L 21/56* | (2006.01) |
| *H01L 21/48* | (2006.01) |
| *H01L 23/31* | (2006.01) |

(Continued)

(52) U.S. Cl.
CPC ...... *H01L 23/5389* (2013.01); *H01L 21/4857* (2013.01); *H01L 21/568* (2013.01); *H01L 23/3135* (2013.01); *H01L 23/49822* (2013.01); *H01L 23/5383* (2013.01); *H01L 24/05* (2013.01); *H01L 24/13* (2013.01); *H01L 24/16* (2013.01); *H01L 24/32* (2013.01); *H01L 24/81* (2013.01); *H01L 25/18* (2013.01); *H01L 25/50* (2013.01); *H01L 2224/02313* (2013.01); *H01L 2224/02331* (2013.01); *H01L 2224/13024* (2013.01); *H01L 2224/16145* (2013.01); *H01L 2224/32225* (2013.01); *H01L 2224/81815* (2013.01)

(58) Field of Classification Search
CPC ............ H01L 23/5389; H01L 23/3135; H01L 23/49822; H01L 23/5383; H01L 21/4857; H01L 21/568; H01L 24/05; H01L 24/13; H01L 24/16; H01L 24/32; H01L 24/81; H01L 25/50; H01L 25/18; H01L 2224/02313; H01L 2224/02331; H01L 2224/13024; H01L 2224/16145; H01L 2224/32225; H01L 2224/81815
See application file for complete search history.

(56) References Cited

U.S. PATENT DOCUMENTS

| 10,340,244 B2 | 7/2019 | Bae et al. |
| 2015/0200182 A1 | 7/2015 | Wang et al. |

(Continued)

FOREIGN PATENT DOCUMENTS

CN 108346646 A 7/2018

*Primary Examiner* — Timor Karimy
(74) *Attorney, Agent, or Firm* — Foley & Lardner LLP

(57) ABSTRACT

A semiconductor package structure includes a first semiconductor die, a second semiconductor die, a third semiconductor die and an external contact. The second semiconductor die is disposed adjacent to the first semiconductor die. The third semiconductor die electrically connects the first semiconductor die and the second semiconductor die. The external contact is electrically connected to the third semiconductor die. An electrical path between the third semiconductor die and the external contact extends through a space between the first semiconductor die and the second semiconductor die.

15 Claims, 29 Drawing Sheets

(51) Int. Cl.
*H01L 25/00* (2006.01)
*H01L 23/498* (2006.01)

(56) References Cited

U.S. PATENT DOCUMENTS

2016/0233203 A1\* 8/2016 Chen .................. H01L 21/6835
2019/0148339 A1  5/2019 Wang et al.
2019/0385977 A1\* 12/2019 Elsherbini ............... H01L 24/81

\* cited by examiner

SEMICONDUCTOR PACKAGE STRUCTURE AND METHOD FOR MANUFACTURING THE SAME

BACKGROUND

1. Field of the Disclosure

The present disclosure relates to a semiconductor package structure and a method, and to a semiconductor package structure including a plurality of semiconductor dice, and a method for manufacturing the semiconductor package structure.

2. Description of the Related Art

A semiconductor package structure may include a substrate, a bridge die disposed on or in the substrate, and two semiconductor dice disposed above the bridge die. The bridge die is disposed between the substrate and the two semiconductor dice, with an active surface of the bridge die faces the two semiconductor dice. Two ends of the bridge die electrically connect a respective one of the two semiconductor dice. The two semiconductor dice are electrically connected to the wiring structure. In such semiconductor package structure, some signal from a semiconductor die is to be transmitted through the bridge die and the other semiconductor die to reach the substrate. Such a long transmitting path may result in signal deficiency or signal attenuation.

SUMMARY

In some embodiments, a semiconductor package structure includes a first semiconductor die, a second semiconductor die, a third semiconductor die and an external contact. The second semiconductor die is disposed adjacent to the first semiconductor die. The third semiconductor die electrically connects the first semiconductor die and the second semiconductor die. The external contact is electrically connected to the third semiconductor die. An electrical path between the third semiconductor die and the external contact extends through a space between the first semiconductor die and the second semiconductor die.

In some embodiments, a semiconductor package structure includes a first semiconductor die, a second semiconductor die, a third semiconductor die and an external contact. The second semiconductor die is disposed adjacent to the first semiconductor die. The third semiconductor die electrically connects the first semiconductor die and the second semiconductor die. The external contact is electrically connected to the third semiconductor die. The first semiconductor die and the second semiconductor die are disposed between the third semiconductor die and the external contact.

In some embodiments, a method for manufacturing a semiconductor package structure includes: (a) providing a wiring structure; (b) disposing a first semiconductor die and a second semiconductor die on the wiring structure; and (c) disposing a third semiconductor die above the first semiconductor die and the second semiconductor die to electrically connect the first semiconductor die and the second semiconductor die.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
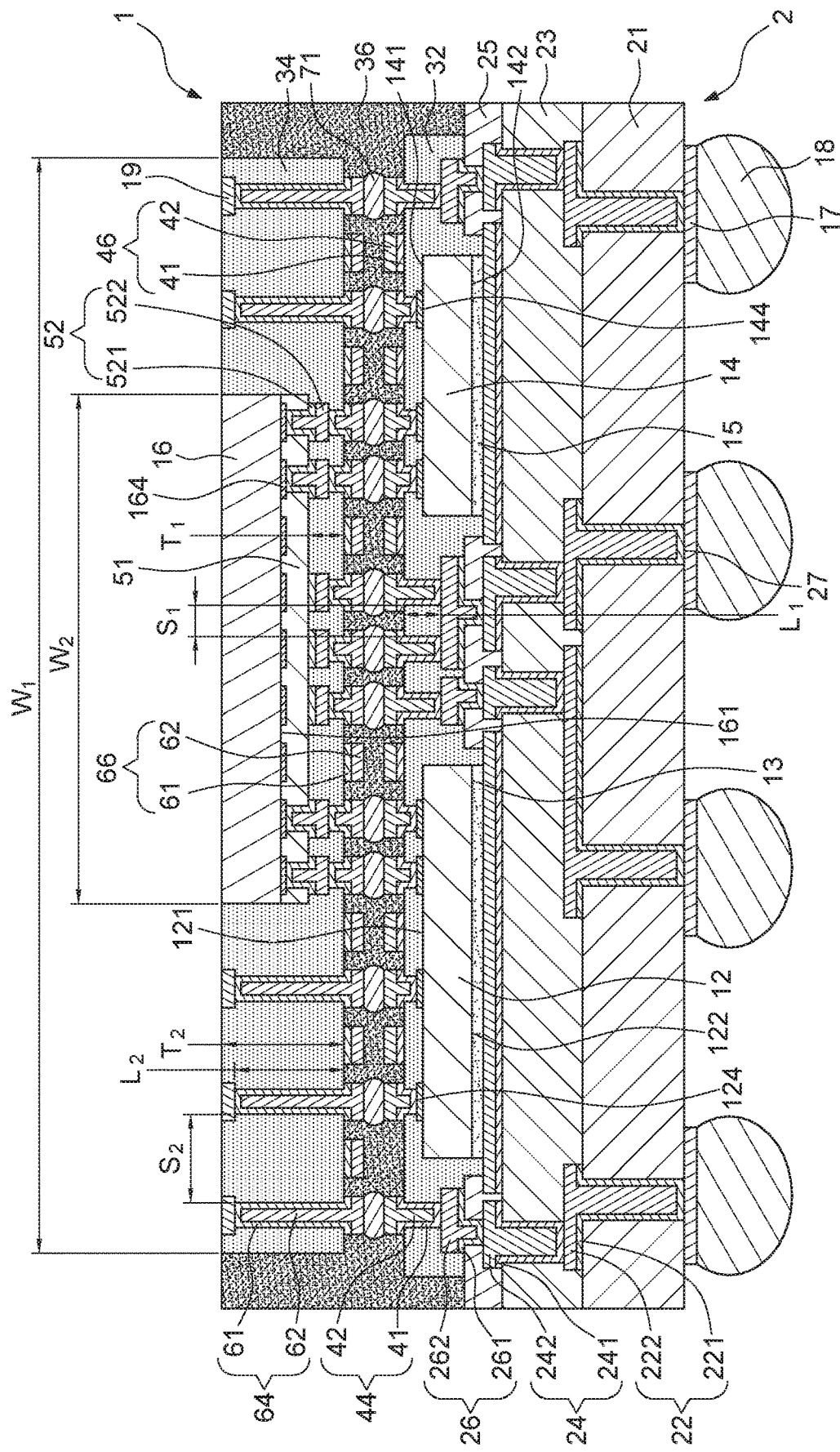
FIG. 1 illustrates a cross-sectional view of an example of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In a comparative embodiment, a semiconductor package structure may include a substrate, a bridge die embedded in the substrate, and two semiconductor dice disposed in a side-by-side manner above the bridge die. The bridge die is disposed between the substrate and the two semiconductor dice, with an active surface of the bridge die faces the two semiconductor dice. For example, a portion of the active surface of the bridge die may face a gap between the two semiconductor dice. The bridge die electrically connects the two semiconductor dice. Thus, the two semiconductor dice are electrically communicated with each other through the bridge die. One end of each of the semiconductor dice is electrically connected to the bridge die, and the other end of each of the semiconductor die is electrically connected to the substrate. Accordingly, some signal from one of the semiconductor dice is to be transmitted through the bridge die and the other one of the semiconductor dice reach the substrate. Such a long signal transmitting path (or electrical path) may result in signal deficiency or signal attenuation.

The present disclosure addresses at least some of the above concerns and provides for a semiconductor package structure in which some signal from a semiconductor die may be transmitted to a wring structure through a bridge and without passing through another semiconductor die. Accordingly, a signal transmitting path between the bridge die and the wiring structure can be shortened. Some embodiments of the present disclosure further provides for a method for manufacturing the semiconductor package structure.

FIG. 1 illustrates a cross-sectional view of a semiconductor package structure 1 according to some embodiments of the present disclosure. The semiconductor package structure 1 may include a wiring structure 2, a first bump pad 17, an external connector 18, a first semiconductor die 12, a first adhesive layer 13, a second semiconductor die 14, a second adhesive layer 15, a first encapsulant 32, a plurality of first pillars 44, a first redistribution layer 46, a plurality of solders 71, a third semiconductor die 16, a plurality of second bump pads 19, a second encapsulant 34, a plurality of second pillars 64, a second redistribution layer 66, and a third encapsulant 36.

The wiring structure 2 may include a lower dielectric layer 21, a lower circuit layer 22, a first dielectric layer 23, a first circuit layer 24, a second dielectric layer 25 and a second circuit layer 26. In some embodiments, the wiring structure 2 may be a substrate, and may include two or more than three dielectric layers and two or more than three circuit layers.

The lower dielectric layer 21 may be a bottommost dielectric layer of the wiring structure 2. A material of the lower dielectric layer 21 may include an insulating material, a passivation material, a dielectric material or a solder resist material, such as, for example, a benzocyclobutene (BCB) based polymer or a polyimide (PI). In some embodiments, the lower dielectric layer 21 may be made of a photoimageable dielectric (PID) material.

The lower circuit layer 22 may be disposed on the lower dielectric layer 21. The lower circuit layer 22 may include a seed layer 221 and a conductive layer 222 sequentially disposed on the lower dielectric layer 21. A material of the seed layer 221 may be titanium, copper, another metal or an alloy. In some embodiments, the seed layer 221 includes a titanium layer and a copper layer. A material of the conductive layer 222 may include, for example, copper, another conductive metal, or an alloy thereof. The lower circuit layer 22 may include at least one conductive via, at least one pad and at least one trace. The conductive via of the lower circuit layer 22 may extend through the lower dielectric layer 21 to form an external contact 27 exposed on a bottom surface of the lower dielectric layer 21. That is, the external contact 27 may be a bottom portion of the conductive via of the lower circuit layer 22, and may be exposed from a bottom surface of the wiring structure 2.

The first dielectric layer 23 is disposed on the lower dielectric layer 21 and covers the lower circuit layer 22. A material of the first dielectric layer 23 may be the same as or similar to the lower dielectric layer 21.

The first circuit layer 24 may be disposed on the first dielectric layer 23. The first circuit layer 24 may include a seed layer 241 and a conductive layer 242 sequentially disposed on the first dielectric layer 23. Materials of the seed layer 241 and the conductive layer 242 of the first circuit layer 24 may be the same as or similar to those of the seed layer 221 and the conductive layer 222 of the lower circuit layer 22. The first circuit layer 24 may include at least one conductive via, at least one pad and at least one trace. The conductive via of the first circuit layer 24 may extend through the first dielectric layer 23 to contact and electrically connect the pad of the lower circuit layer 22.

The second dielectric layer 25 is disposed on the first dielectric layer 23 and covers the first circuit layer 24. A material of the second dielectric layer 25 may be the same as or similar to the first dielectric layer 23. The second dielectric layer 25 may define a plurality of openings to expose portions of the first circuit layer 24.

The second circuit layer 26 may be disposed on the second dielectric layer 25. The second circuit layer 26 may include a seed layer 261 and a conductive layer 262 sequentially disposed on the second dielectric layer 25. Materials of the seed layer 261 and the conductive layer 262 of the second circuit layer 26 may be the same as or similar to those of the seed layer 241 and the conductive layer 242 of the first circuit layer 24. The second circuit layer 26 may include at least one conductive via, at least one pad and at least one trace. The conductive via of the second circuit layer 26 may extend through the second dielectric layer 25 to contact and electrically connect the pad of the first circuit layer 24.

The first bump pad 17 is disposed on the wiring structure 2 and electrically connected to the external contact 27. The external connector 18 (e.g., solder ball) is disposed on the first bump pad 17. For example, the wiring structure 2 may have a first side (e.g., top side) and a second side (e.g., bottom side). The first side may be adjacent to the first circuit layer 24, the second dielectric layer 25 and the second circuit layer 26. The second side may be adjacent to the lower dielectric layer 21. The external contact 27, the first bump pad 17 and the external connector 18 are disposed adjacent to the second side of the wiring structure 2. In some embodiments, the first bump pad 17 may be omitted, and the external connector 18 may be disposed on the external contact 27.

In some embodiments, the first semiconductor die 12 may be an application-specific integrated circuit (ASIC) die, and the second semiconductor die 14 may be a high bandwidth memory (HBM) die. The first semiconductor die 12 and the second semiconductor die 14 may be disposed on and adhered to the wiring structure 2, such as the first side of the wiring structure 2. The second semiconductor die 14 may be disposed adjacent to, or side-by-side with, the first semiconductor die 12. For example, the first semiconductor die 12 and the second semiconductor die 14 may be disposed in the openings of the second dielectric layer 25, thus, the first semiconductor die 12 and the second semiconductor die 14 may be disposed on the exposed portion of the first circuit layer 24 of the wiring structure 2. The second circuit layer 26 may be adjacent to, or may surround the first semiconductor die 12 and/or the second semiconductor die 14. In some embodiments, a portion of the second circuit layer 26 may be disposed between the first semiconductor die 12 and the second semiconductor die 14.

In some embodiments, the first semiconductor die 12 may have an active surface 121, and a backside surface 122 opposite to the active surface 121. The first semiconductor die 12 may include at least one first conductive pad 124 disposed on the active surface 121. Similarly, the second semiconductor die 14 may have an active surface 141, and a backside surface 142 opposite to the active surface 141. The second semiconductor die 14 may include at least one second conductive pad 144 disposed on the active surface 141. The backside surface 122 of the first semiconductor die 12 and the backside surface 142 of the second semiconductor die 14 may face the wiring structure 2, and may be adhered to the exposed portion of the first circuit layer 24 by the first adhesive layer 13 and the second adhesive layer 15, respectively.

The first encapsulant 32 may be disposed on the wiring structure 2 and cover the first semiconductor die 12 and/or the second semiconductor die 14. The first encapsulant 32 may be disposed on the second dielectric layer 25 and cover the second circuit layer 26. In some embodiments, a portion of the first encapsulant 32 is disposed between the first semiconductor die 12 and the second semiconductor die 14. The first encapsulant 32 may be a dielectric layer, and may define a plurality of openings to expose the first conductive pad 124 of the first semiconductor die 12, the second conductive pad 144 of the second semiconductor die 14 and portions of the second circuit layer 26.

The first pillars 44 are disposed adjacent to, or surrounds, the first semiconductor die 12 and/or the second semiconductor die 14. The first pillars 44 may be disposed in the openings of the first encapsulant 32, and may extend into or extend through the first encapsulant 32 to electrically connect the second circuit layer 26. In some embodiments, at least one of the first pillars 44 is disposed between the first semiconductor die 12 and the second semiconductor die 14. The first pillars 44 are electrically connected to the first circuit layer 24 through the second circuit layer 26. Due to the existence of the second circuit layer 26, a height of the first pillar 44 may be reduced.

The first redistribution layer 46 is disposed on the first encapsulant 32, and is electrically connected to the first semiconductor die 12 and/or the second semiconductor die 14. The first redistribution layer 46 may include at least one trace, at least one pad and at least one via. The via of the first redistribution layer 46 may be disposed in the opening of the first encapsulant 32, and may extend into or extend through the first encapsulant 32 to electrically connect the first conductive pad 124 of the first semiconductor die 12 and/or the second conductive pad 144 of the second semiconductor die 14. The first redistribution layer 46 may be formed integrally and concurrently with the first pillars 44. As shown in FIG. 1, the first redistribution layer 46 and the first pillars 44 may include a seed layer 41 and a conductive layer 42. Materials of the seed layer 41 and the conductive layer 42 of the first redistribution layer 46 and the first pillars 44 may be the same as or similar to those of the seed layer 261 and the conductive layer 262 of the second circuit layer 26 of the wiring structure 2. The solders 71 may be disposed on the first pillars 44 and the first redistribution layer 46.

The third semiconductor die 16 electrically connects the first semiconductor die 12 and the second semiconductor die 14. In some embodiments, the third semiconductor die 16 may be a bridge die. The third semiconductor die 16 may be disposed above the first semiconductor die 12 and/or the second semiconductor die 14. As shown in FIG. 1, the first semiconductor die 12 and the second semiconductor die 14 are disposed between the third semiconductor die 16 and the external contact 27 of the wiring structure 2.

In some embodiments, the third semiconductor die 16 has an active surface 161. The third semiconductor die 16 may include at least one third conductive pad 164 disposed on the active surface 161. The active surface 161 faces the wiring structure 2, and a portion of the active surface 161 faces a gap between the first semiconductor die 12 and the second semiconductor die 14. The third semiconductor die 16 may further include a sub-micro circuit structure, including a dielectric layer 51 and a redistribution layer 52, disposed on the active surface 161 of the third semiconductor die 16. For example, the dielectric layer 51 is disposed on the active surface 161 of the third semiconductor die 16 and covers the third conductive pad 164. A material of the dielectric layer 51 may be the same as or similar to the material of the second dielectric layer 25 of the wiring structure 2. The redistribution layer 52 is disposed on and extends through the dielectric layer 51 to electrically connect the conductive pad 164. In some embodiments, the redistribution layer 52 may include a seed layer 521 and a conductive layer 522. Materials of the seed layer 521 and the conductive layer 522 of the redistribution layer 52 of the sub-micro circuit structure may be the same as or similar to those of the seed layer 261 and the conductive layer 262 of the second circuit layer 26.

The second bump pads 19 may be disposed adjacent to, or surround, the third semiconductor die 16. The second bump pads 19 may provide for external connection function. The second encapsulant 34 may cover the third semiconductor die 16 and the second bump pads 19. In some embodiments, the second encapsulant 34 may include a first portion and a second portion. The first portion is disposed on the third semiconductor die 16, and covers the dielectric layer 51 of the third semiconductor die 16. The second portion surrounds the third semiconductor die 16 and contacts a lateral surface of the third semiconductor die 16. A thickness $T_1$ of the first portion is less than a thickness $T_2$ of the second portion. A width $W_1$ of the second encapsulant 34 is greater than a width W2 of the third semiconductor die 16.

The second pillars 64 may be disposed adjacent to, or surround, the third semiconductor die 16. The second pillars 64 may extend into or extend through the second encapsulant 34 to electrically connect the second bump pads 19. In some embodiments, some of the second pillars 64 may be dummy pillars. That is, some of the second pillars 64 may not provide for electrical connection, but merely provide for structural support.

The first pillars 44 may have a maximum length $L_1$ which may be measured along a direction from a top surface of the second circuit layer 26 to a top surface of the first encapsulant 32. The second pillars 64 may have a maximum length $L_2$ which may be measured along a direction from a bottom surface of the second bump pad 19 to a bottom surface of the second encapsulant 34. The maximum length $L_1$ of the first pillars 44 is less than a maximum length $L_2$ of the second pillars 64. Besides, a pillar space $S_1$ may be defined between sidewalls of adjacent two of the first pillars 44. A pillar space $S_2$ may be defined between sidewalls of adjacent two of the second pillars 64. The pillar space $S_1$ between the first pillars 44 is less than a pillar space $S_2$ between the second pillars 64.

The second redistribution layer 66 is disposed on the second encapsulant 34. The second redistribution layer 66 may extend into or extend through the second encapsulant 34 to electrically connect the third semiconductor die 16, such as the redistribution layer 52 of the sub-micro circuit structure of the third semiconductor die 16. The second redistribution layer 66 may include at least one trace, at least one pad and at least one via. The second redistribution layer 66 may be formed integrally and concurrently with the second pillars 64. As shown in FIG. 1, the second redistribution layer 66 and the second pillars 64 may include a seed layer 61 and a conductive layer 62. Materials of the seed layer 61 and the conductive layer 62 of the second redistribution layer 66 and the second pillars 64 may be the same as or similar to those of the seed layer 41 and the conductive layer 42 of the first redistribution layer 46 and the first pillars 44. The second redistribution layer 66 may be electrically connected to the first redistribution layer 46 through the solder 71, such that the third semiconductor die 16 electrically connects the first semiconductor die 12 and the second semiconductor die 14.

At least one of the first pillars 44 may be electrically connected to the third semiconductor die 16, such as through the solders 71 on the second redistribution layer 52. At least one of the second pillars 64 may be electrically connected to the first semiconductor die 12 and/or the second semiconductor die 14, such as through the solders 71 and the first redistribution layer 46. Besides, at least another one of the second pillars 64 may be connected to at least another one of the first pillars 44.

The third encapsulant 36 is disposed between and covers the first encapsulant 32 and the second encapsulant 34. The encapsulant 36 may cover and contact the first redistribution layer 46, the second redistribution layer 66 and the solders 71. In some embodiments, the third encapsulant 36 may include molding compound with or without fillers.

In the semiconductor package structure 1, a portion of the third semiconductor die 16 may be electrically connected to the wiring structure 2 directly without through the first semiconductor die 12 and the second semiconductor die 14. For example, the external contact 27 may be electrically connected to the third semiconductor die 16 through the wiring structure 2, the first pillars 44, the solders 71, the second redistribution layer 66 and the redistribution layer 52 of the sub-micro circuit structure. An electrical path (or a signal transmitting path) between the third semiconductor die 16 and the external contact 27 may extend through a space between the first semiconductor die 12 and the second semiconductor die 14. In some embodiments, the electrical path (or the signal transmitting path) may include at least one of the first pillars 44 disposed between the first semiconductor die 12 and the second semiconductor die 14. In some embodiments, the electrical path (or the signal transmitting path) may further include at least a portion of the second circuit layer 26 disposed between the first semiconductor die 12 and the second semiconductor die 14, which is disposed under the first pillars 44. Due to the arrangement of the electrical path (or the signal transmitting path), some electrical signal from one of the first semiconductor die 12 and the second semiconductor die 14 may be transmitted to the external contact 27 through the third semiconductor die 16, the first pillars 44 and the wiring structure 2 without passing through another one of the first semiconductor die 12 and the second semiconductor die 14. Accordingly, the electrical path (or the signal transmitting path) may be sufficiently shortened. Such a short electrical path (or signal transmitting path) may improve the signal intensity and signal integrity.

Figure 2:
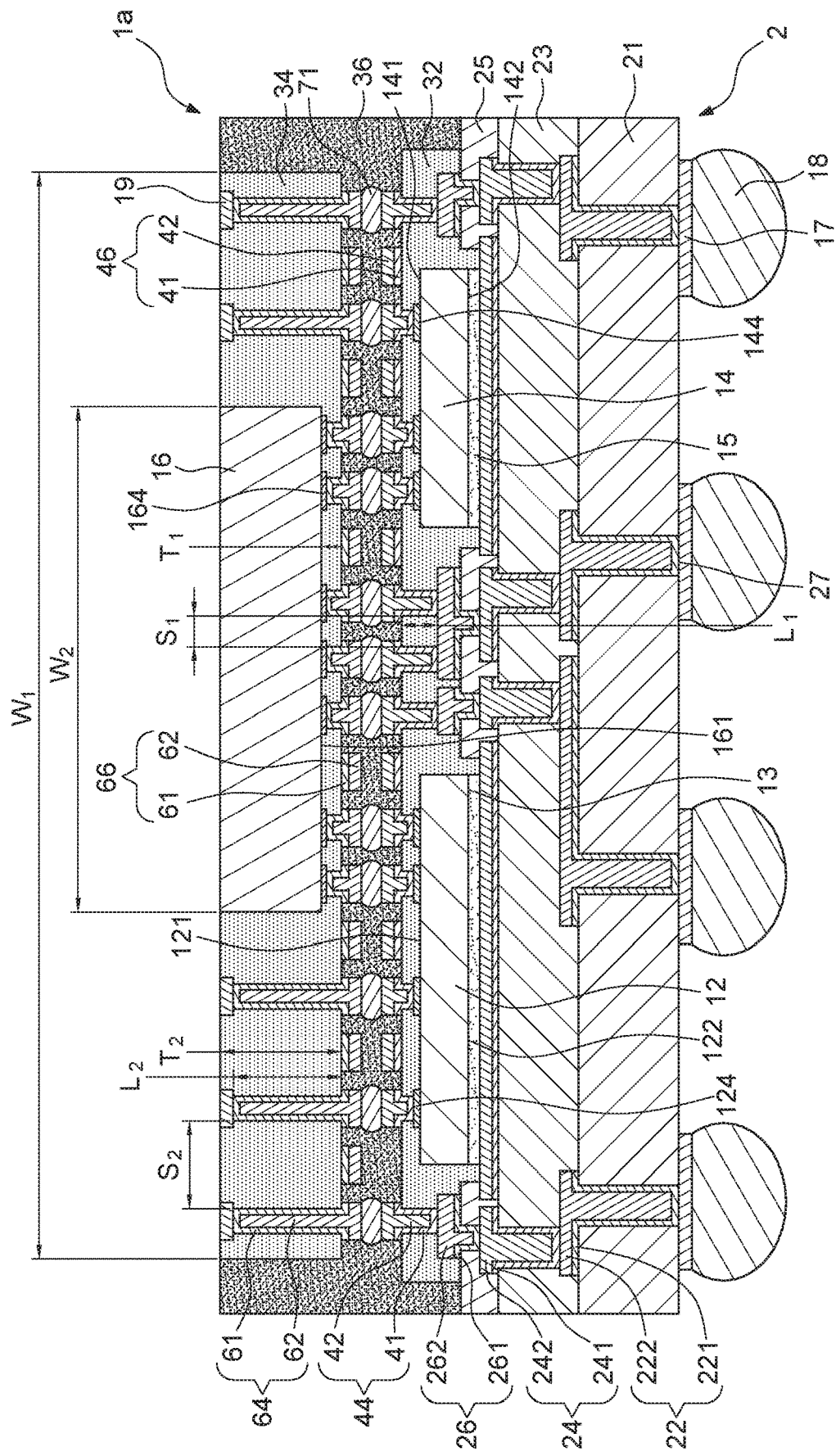
FIG. 2 illustrates a cross-sectional view of an example of a semiconductor package structure according to some embodiments of the present disclosure.

FIG. 2 illustrates a cross-sectional view of a semiconductor package structure 1a according to some embodiments of the present disclosure. The semiconductor package structure 1a is similar to the semiconductor package structure 1 shown in FIG. 1, except that the sub-micro circuit structure (including the dielectric layer 51 and the redistribution layer 52) of the third semiconductor die 16 is omitted. Accordingly, the second redistribution layer 66 contacts and electrically connects the third conductive pad 164.

Figure 3:
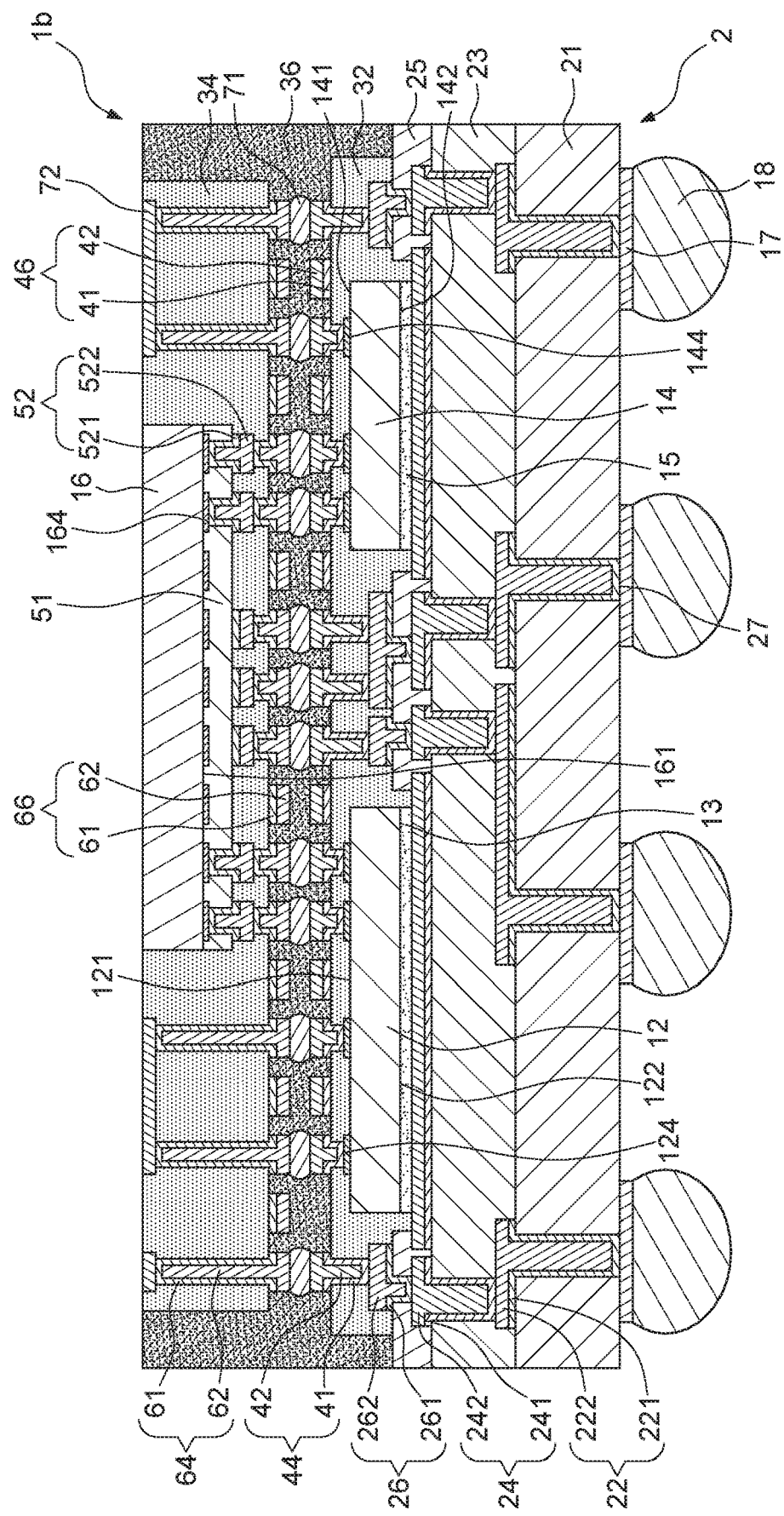
FIG. 3 illustrates a cross-sectional view of an example of a semiconductor package structure according to some embodiments of the present disclosure.

FIG. 3 illustrates a cross-sectional view of a semiconductor package structure 1b according to some embodiments of the present disclosure. The semiconductor package structure 1b is similar to the semiconductor package structure 1 shown in FIG. 1, except that the second bump pads 19 are replaced by a redistribution layer 72 for further electrical function.

Figure 4:
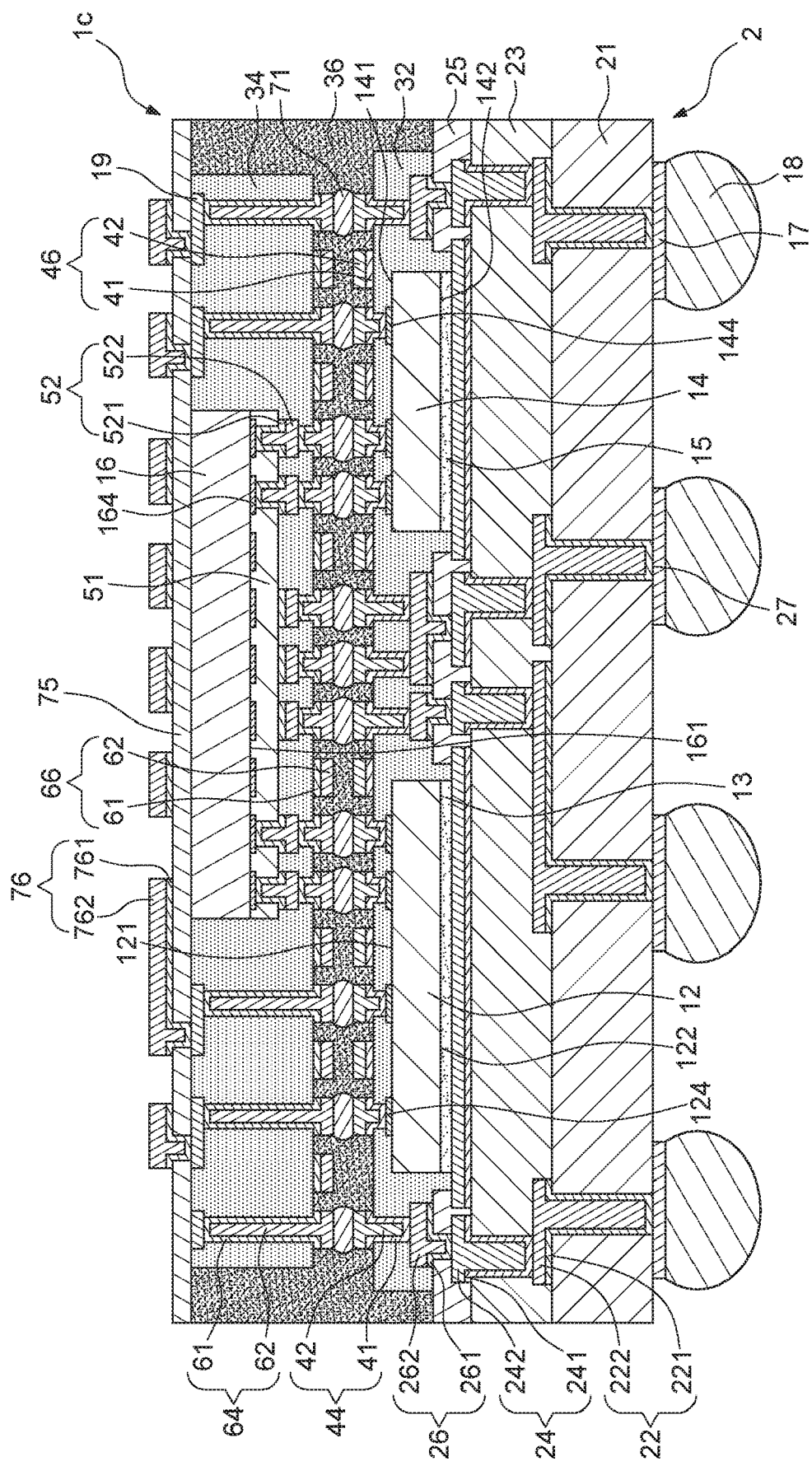
FIG. 4 illustrates a cross-sectional view of an example of a semiconductor package structure according to some embodiments of the present disclosure.

FIG. 4 illustrates a cross-sectional view of a semiconductor package structure 1c according to some embodiments of the present disclosure. The semiconductor package structure 1c is similar to the semiconductor package structure 1 shown in FIG. 1, but further includes an upper circuit structure for further electrical function. As shown in FIG. 4, the upper circuit structure may include an upper dielectric layer 75 and an upper circuit layer 76. The upper dielectric layer 75 is disposed on and covers the third encapsulant 36, the second encapsulant 34, the second bump pads 19, and the third semiconductor die 16. A material of the upper dielectric layer 75 may be the same as or similar to the material of the second dielectric layer 25 of the wiring structure 2. The upper circuit layer 76 extends through the upper dielectric layer 75 to electrically connect the second bump pads 19. The upper circuit layer 76 includes a seed layer 761 and a conductive layer 762. Materials of the seed layer 761 and the conductive layer 762 of the upper circuit layer 76 may be the same as or similar to those of the seed layer 261 and the conductive layer 262 of the second circuit layer 26 of the wiring structure 2.

Figure 5:
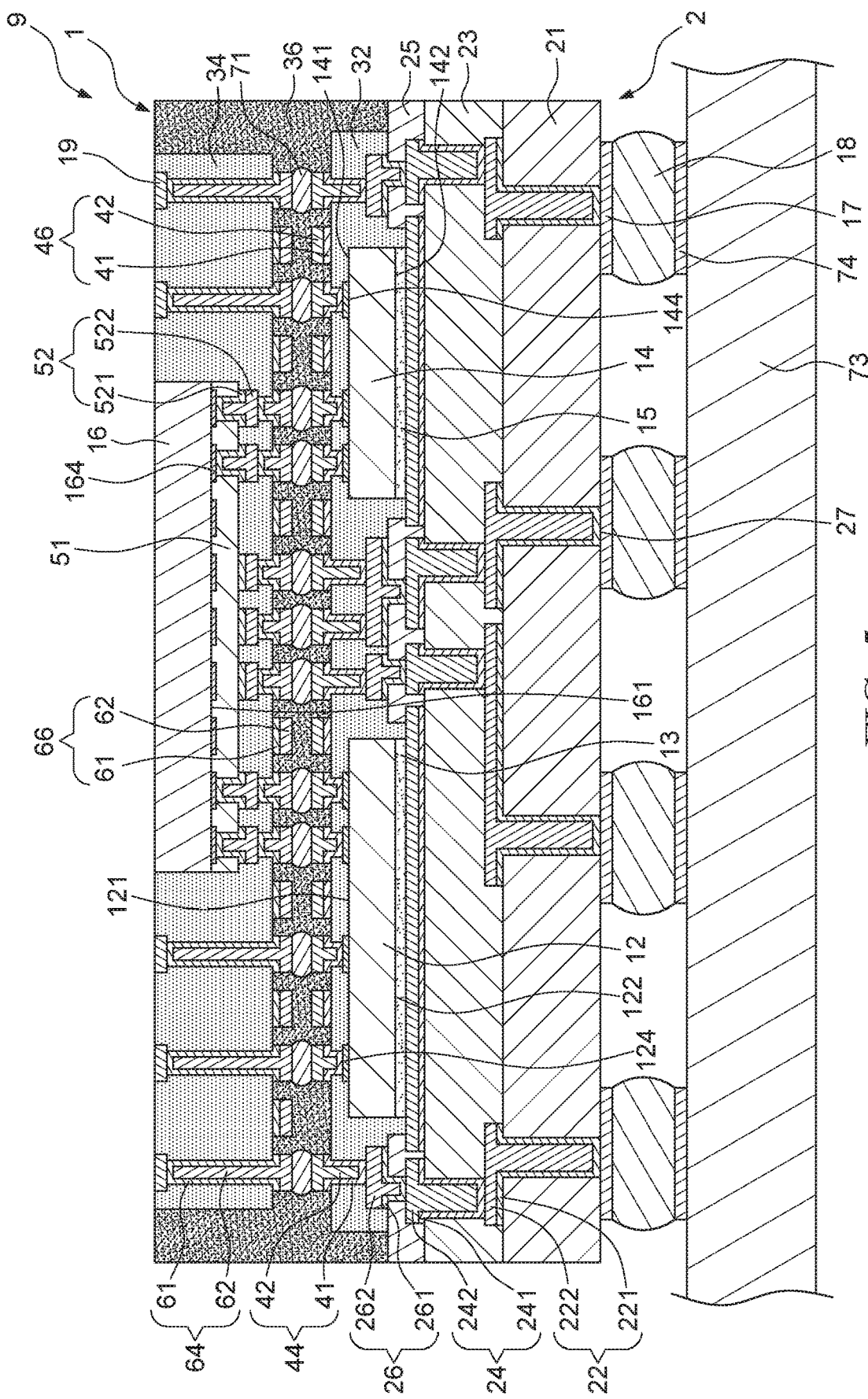
FIG. 5 illustrates a cross-sectional view of an example of a semiconductor assembly according to some embodiments of the present disclosure.

FIG. 5 illustrates a cross-sectional view of a semiconductor assembly 9 according to some embodiments of the present disclosure. The semiconductor assembly 9 includes the semiconductor package structure 1 electrically connected to a substrate 73. In some embodiments, the substrate 73 may be a printed circuit board (PCB) substrate. The substrate 73 may include at least one bump pad 74. The first bump pad 17 of the wiring structure 2 of the semiconductor package structure 1 is connected to the bump pad 74 of the substrate 73 through the external connector 18.

FIG. 6 through FIG. 29 illustrate a method for manufacturing a semiconductor package structure according to some embodiments of the present disclosure. In some embodiments, the method is for manufacturing a semiconductor package structure, such as the semiconductor package structure 1 shown in FIG. 1.

Figure 6:
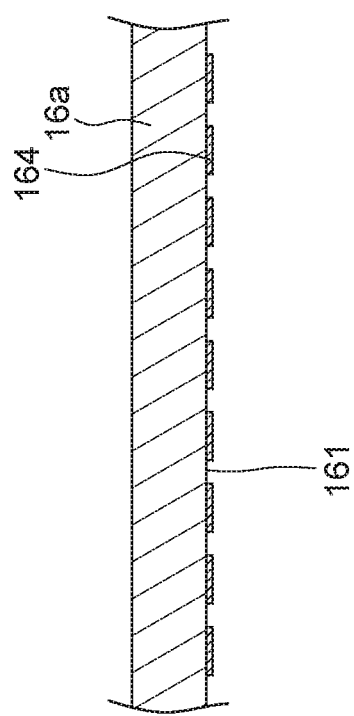
FIG. 6 illustrates one or more stages of an example of a method for manufacturing a semiconductor package structure according to some embodiments of the present disclosure.

Referring to FIG. 6, a base material 16a is provided. The base material 16a may be in a wafer type or a strip type. The base material 16a has an active surface 161, and may include at least one third conductive pad 164 disposed on the active surface 161. A material of the base material 16a may include silicon.

Figure 7:
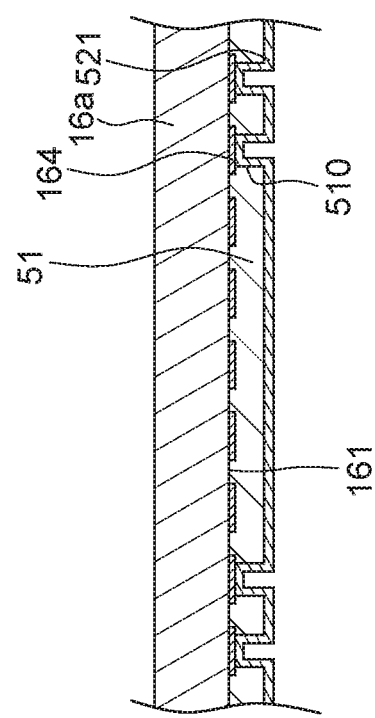
FIG. 7 illustrates one or more stages of an example of a method for manufacturing a semiconductor package structure according to some embodiments of the present disclosure.

Referring to FIG. 7, a dielectric layer 51 is formed or disposed on the active surface 161 of the base material 16a to cover the third conductive pad 164. The dielectric layer 51 defines at least one through hole 510 to expose the third conductive pad 164. The through hole 510 may be formed by mechanical drilling, laser drilling, or lithographic techniques. Then, a seed layer 521 is disposed on the dielectric layer 51 and extends into the through hole 510 to contact and electrically connect the third conductive pad 164.

Figure 8:
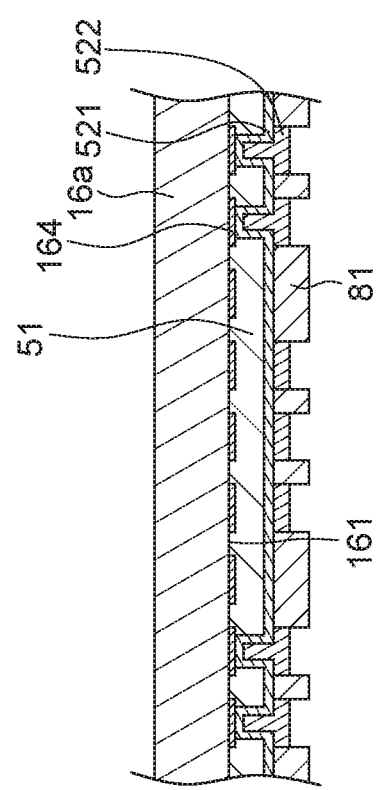
FIG. 8 illustrates one or more stages of an example of a method for manufacturing a semiconductor package structure according to some embodiments of the present disclosure.

Referring to FIG. 8, a patterned photoresist 81 is formed or disposed on the seed layer 521 and exposes portions of the seed layer 521. The patterned photoresist 81 may be made of a photoimageable material and may be patterned by exposure and development. Then, a conductive layer 522 is disposed on the exposed portions of the seed layer 521 by, for example, plating.

Figure 9:
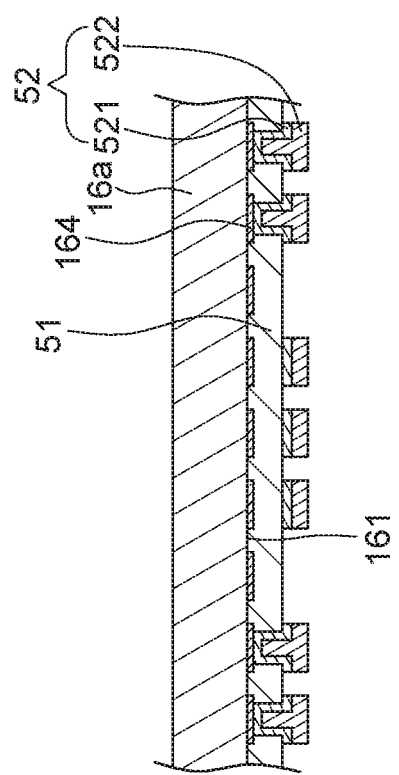
FIG. 9 illustrates one or more stages of an example of a method for manufacturing a semiconductor package structure according to some embodiments of the present disclosure.

Referring to FIG. 9, the patterned photoresist 81 is removed. Then, portions of the seed layer 521 that are not covered by the conductive layer 522 may be removed by, for example, etching, thus forming a redistribution layer 52. The redistribution layer 52 is disposed on and extends through the dielectric layer 51 to electrically connect the conductive pad 164. Accordingly, a sub-micro circuit structure is formed and includes the dielectric layer 51 and the redistribution layer 52.

Figure 10:
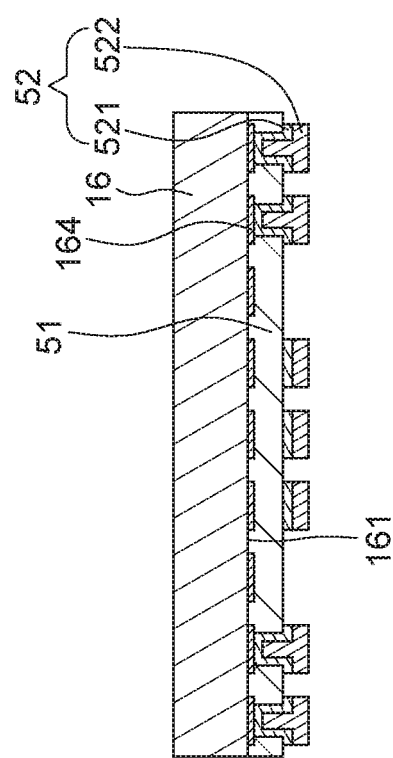
FIG. 10 illustrates one or more stages of an example of a method for manufacturing a semiconductor package structure according to some embodiments of the present disclosure.

Referring to FIG. 9, the base material 16a and the sub-micro circuit structure are singulated, thus forming a plurality of third semiconductor dice 16 as shown in FIG. 10.

Figure 11:
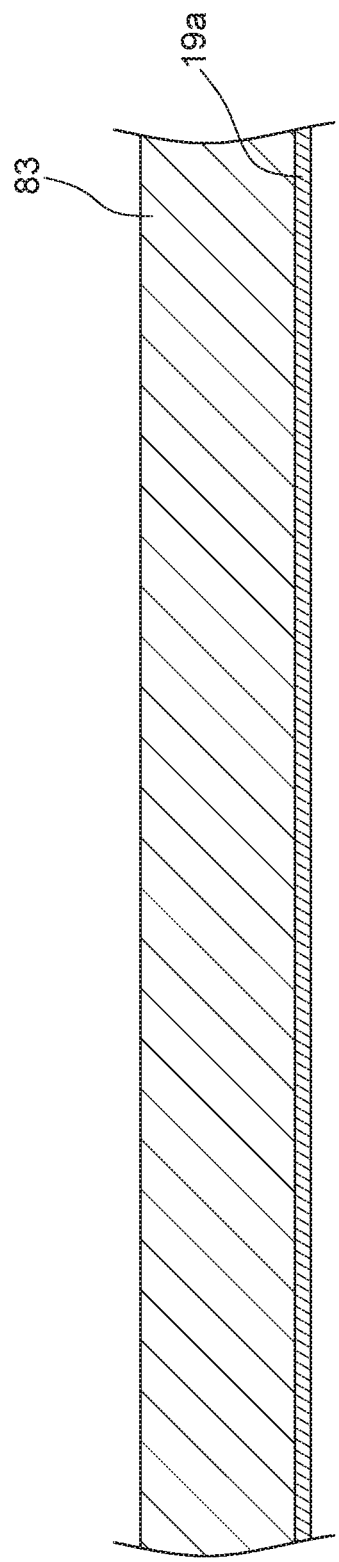
FIG. 11 illustrates one or more stages of an example of a method for manufacturing a semiconductor package structure according to some embodiments of the present disclosure.

Referring to FIG. 11, a carrier 83 is provided. A metal layer 19a is formed or disposed on on the carrier 83.

Figure 12:
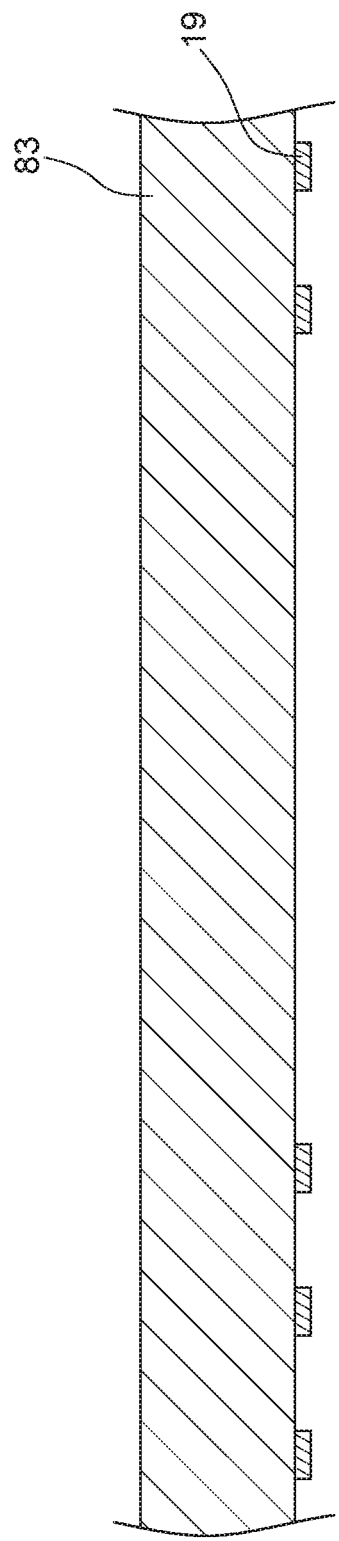
FIG. 12 illustrates one or more stages of an example of a method for manufacturing a semiconductor package structure according to some embodiments of the present disclosure.

Referring to FIG. 12, portions of the metal layer 19a is removed by, for example, etching, to form a plurality of second bump pads 19 on the carrier 83.

Figure 13:
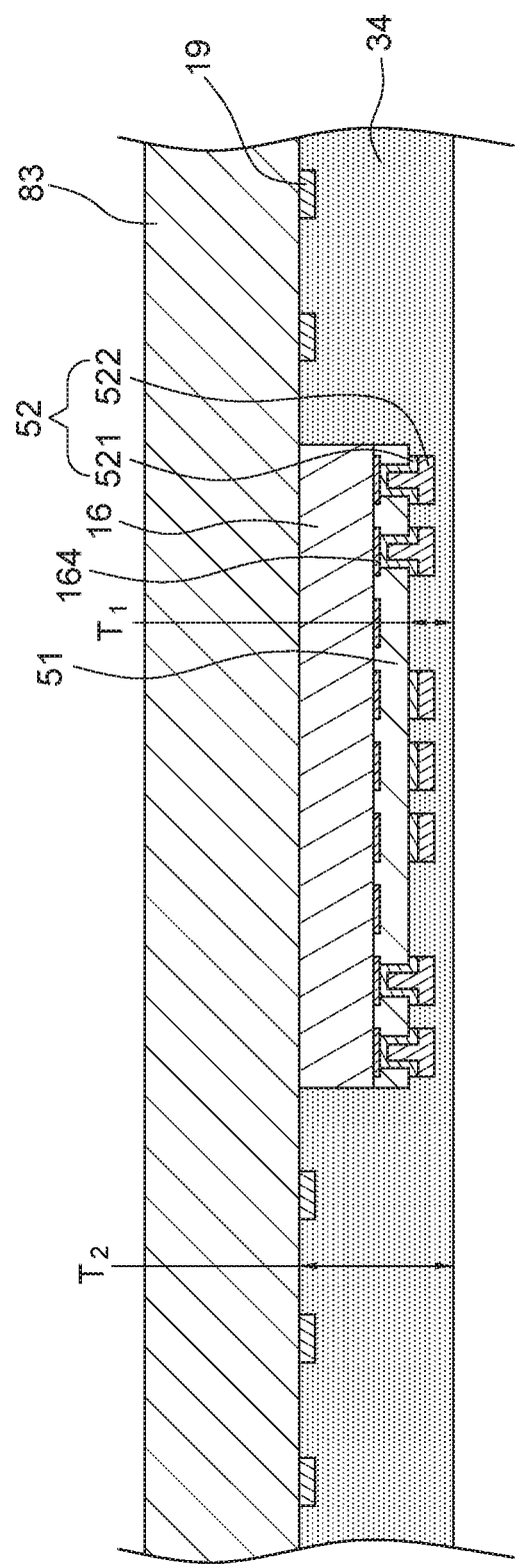
FIG. 13 illustrates one or more stages of an example of a method for manufacturing a semiconductor package structure according to some embodiments of the present disclosure.

Referring to FIG. 13, the third semiconductor die 16, as shown in FIG. 10, is disposed on the carrier 83. Then, a second encapsulant 34 is formed or disposed on the carrier 83 to cover the third semiconductor die 16 and the second bump pads 19. In some embodiments, the second encapsulant 34 may include a first portion and a second portion. The first portion is disposed on the third semiconductor die 16, and covers the dielectric layer 51 of the third semiconductor die 16. The second portion surrounds the third semiconductor die 16 and contacts a lateral surface of the third semiconductor die 16. A thickness $T_1$ of the first portion is less than a thickness $T_2$ of the second portion.

Figure 14:
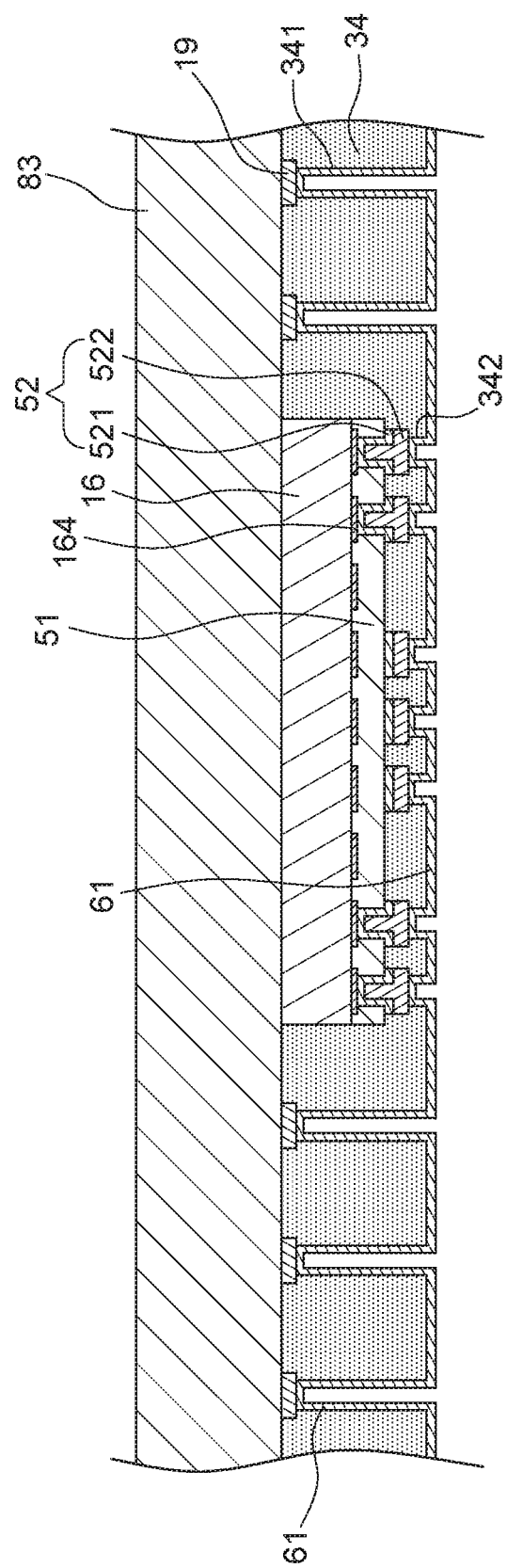
FIG. 14 illustrates one or more stages of an example of a method for manufacturing a semiconductor package structure according to some embodiments of the present disclosure.

Referring to FIG. 14, a plurality of first through holes 341 is formed and extends through the second portion of the second encapsulant 34 to expose the bump pads 19. A plurality of second through holes 342 is formed and extends through the first portion of the second encapsulant 34 to expose the sub-micro circuit structure (e.g., the redistribution layer 52). The first through holes 341 and the second through holes 342 may be formed by mechanical drilling, laser drilling, or lithographic techniques. Then, a seed layer 61 is formed or disposed on the second encapsulant 34 and extends into the first through holes 341 and the second through holes 342 to contact and electrically connect the bump pads 19 and the sub-micro circuit structure (e.g., the redistribution layer 52), respectively.

Figure 15:
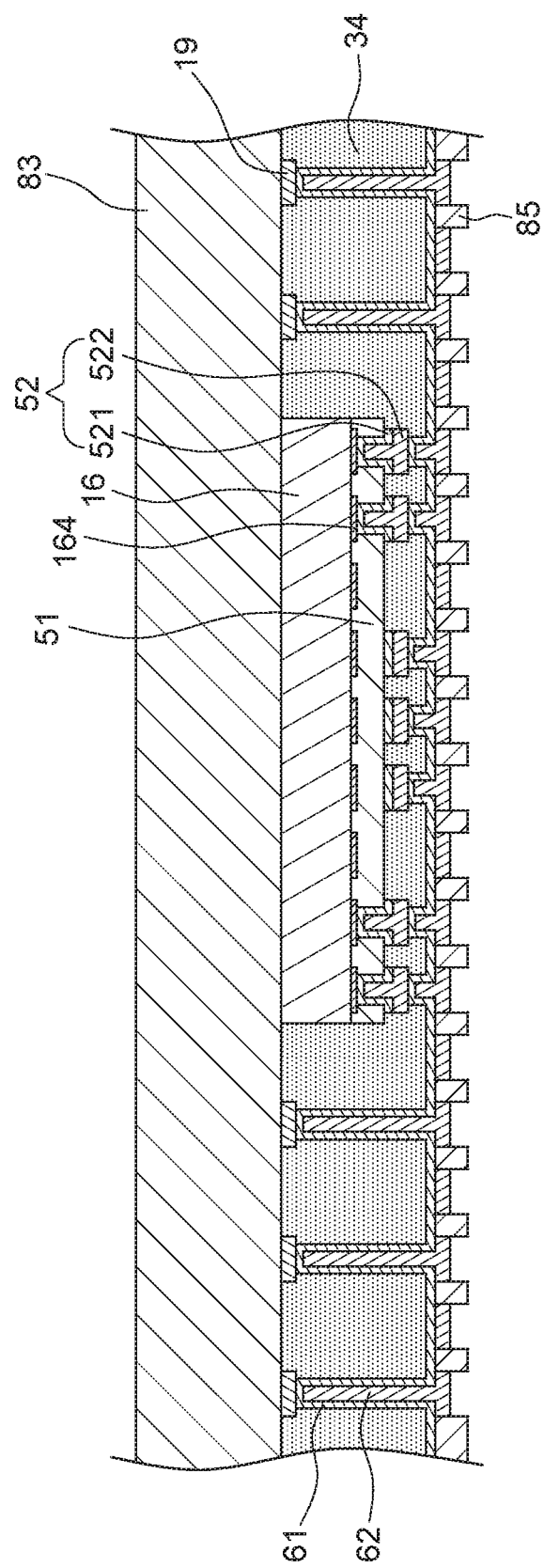
FIG. 15 illustrates one or more stages of an example of a method for manufacturing a semiconductor package structure according to some embodiments of the present disclosure.

Referring to FIG. 15, a patterned photoresist 85 is formed or disposed on the seed layer 61 and exposes a portion of the seed layer 61. The patterned photoresist 85 may be made of a photoimageable material and may be patterned by exposure and development. Then, a conductive layer 62 is disposed on the exposed portions of the seed layer 61 by, for example, plating.

Figure 16:
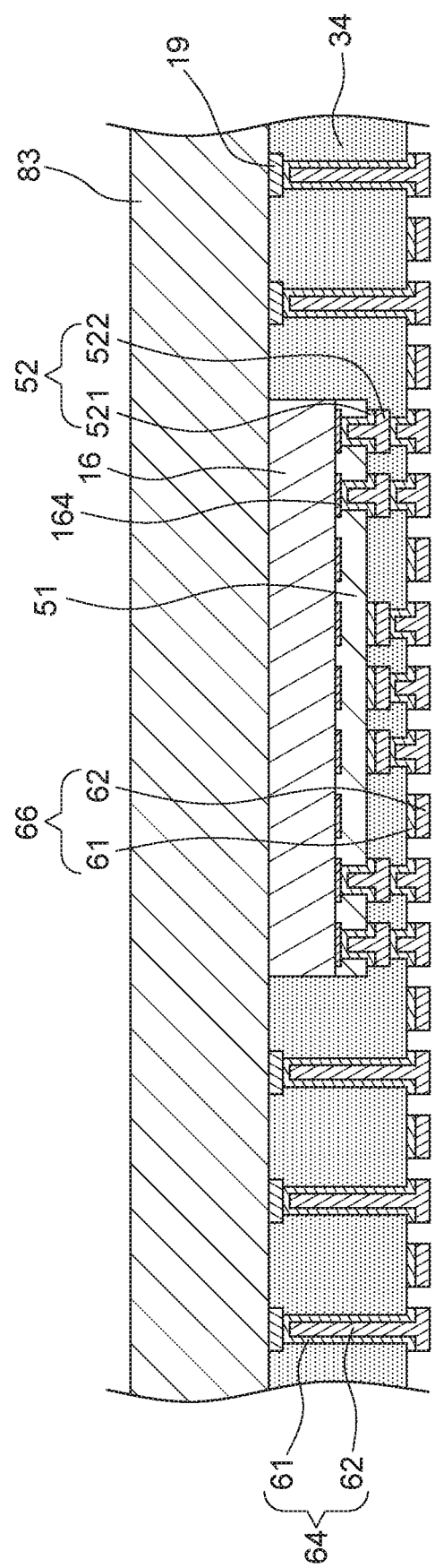
FIG. 16 illustrates one or more stages of an example of a method for manufacturing a semiconductor package structure according to some embodiments of the present disclosure.
Figure 17:
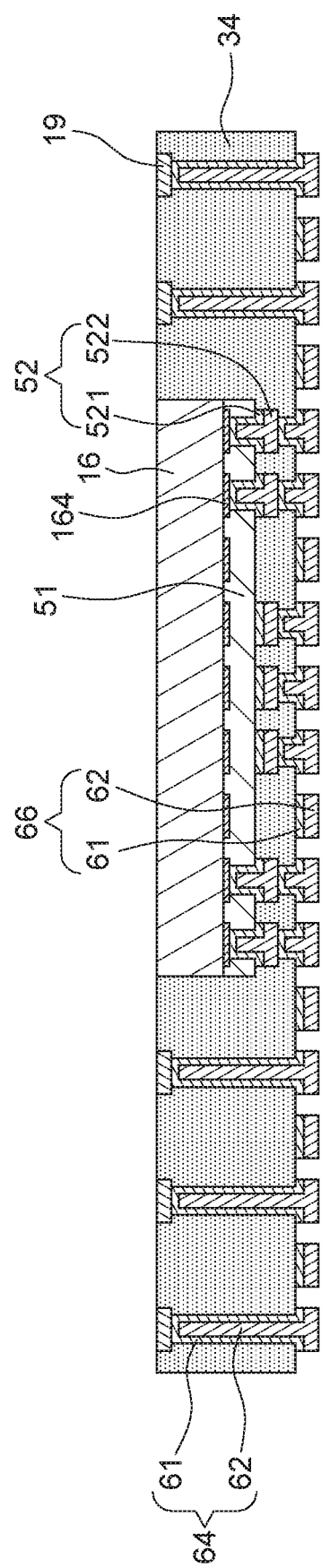
FIG. 17 illustrates one or more stages of an example of a method for manufacturing a semiconductor package structure according to some embodiments of the present disclosure.

Referring to FIG. 16, the patterned photoresist 85 is removed. Then, portions of the seed layer 61 not covered by the conductive layer 62 may be removed by, for example, etching, thus forming a plurality of second pillars 64 and a second redistribution layer 66 integrally and concurrently. The second redistribution layer 66 and the second pillars 64 include the seed layer 61 and the conductive layer 62. The second pillars 64 extend into or extend through the second encapsulant 34 to electrically connect the second bump pads 19. In some embodiments, some of the second pillars 64 may be dummy pillars. That is, some of the second pillars 64 may not provide for electrical connection, but merely provide for structural support. The second redistribution layer 66 is disposed on the second encapsulant 34. The second redistribution layer 66 may extend into or extend through the second encapsulant 34 to electrically connect the third semiconductor die 16, such as the redistribution layer 52 of the sub-micro circuit structure of the third semiconductor die 16. The second redistribution layer 66 may include at least one trace, at least one pad and at least one via. Then, the encapsulant 3 is singulated, and the carrier 83 is removed to form a structure as shown in FIG. 17.

Figure 18:
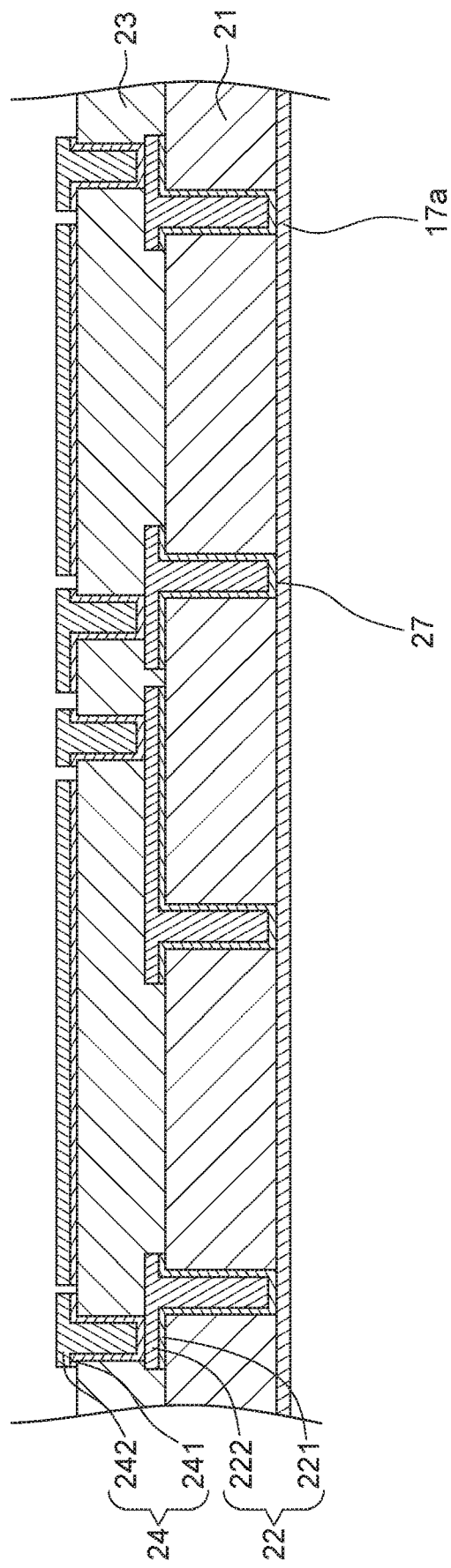
FIG. 18 illustrates one or more stages of an example of a method for manufacturing a semiconductor package structure according to some embodiments of the present disclosure.

Referring to FIG. 18, a metal layer 17a is provided. A lower dielectric layer 21 is formed or disposed on the metal layer 17a.

A lower circuit layer 22 is formed or disposed on the lower dielectric layer 21. The lower circuit layer 22 may include a seed layer 221 and a conductive layer 222 sequentially disposed on the lower dielectric layer 21. The lower circuit layer 22 may include at least one conductive via, at least one pad and at least one trace. The conductive via of the lower circuit layer 22 may extend through the lower dielectric layer 21 to form an external contact 27 on a bottom surface of the lower dielectric layer 21 which contacts and electrically connects the metal layer 17a. That is, the external contact 27 may be a bottom portion of the conductive via of the lower circuit layer 22, and may be exposed from a bottom surface of the wiring structure 2.

A first dielectric layer 23 is formed or disposed on the lower dielectric layer 21 and covers the lower circuit layer 22. A material of the first dielectric layer 23 may be the same as or similar to the lower dielectric layer 21.

A first circuit layer 24 is formed or disposed on the first dielectric layer 23. The first circuit layer 24 may include a seed layer 241 and a conductive layer 242 sequentially disposed on the first dielectric layer 23. Materials of the seed layer 241 and the conductive layer 242 of the first circuit layer 24 may be the same as or similar to those of the seed layer 221 and the conductive layer 222 of the lower circuit layer 22. The first circuit layer 24 may include at least one conductive via, at least one pad and at least one trace. The conductive via of the first circuit layer 24 may extend through the first dielectric layer 23 to contact and electrically connect the pad of the lower circuit layer 22. Processes for forming the lower dielectric layer 21, the lower circuit layer 22, the first dielectric layer 23 and the first circuit layer 24 may be similar to the processes for forming the sub-micro circuit structure (e.g., including the dielectric layer 51 and the redistribution layer 52) of the third semiconductor die 16.

Figure 19:
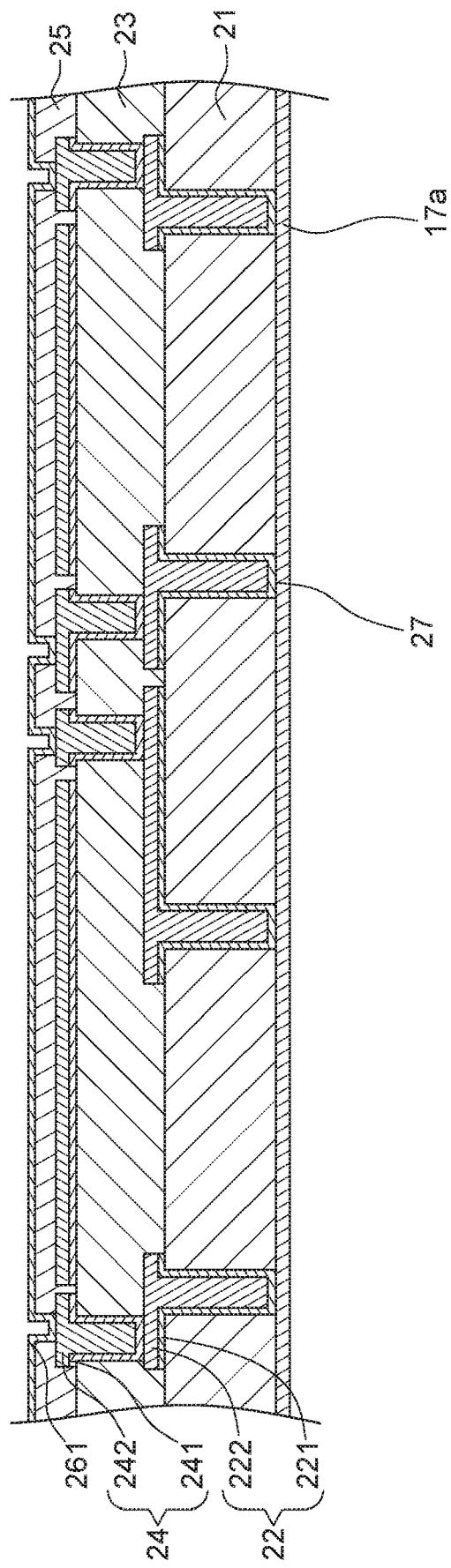
FIG. 19 illustrates one or more stages of an example of a method for manufacturing a semiconductor package structure according to some embodiments of the present disclosure.

Referring to FIG. 19, a second dielectric layer 25 is formed or disposed on the first dielectric layer 23 and covers the first circuit layer 24. The second dielectric layer 25 may define a plurality of openings to expose portions of the first circuit layer 24. Then a seed layer 261 is formed or disposed on the second dielectric layer 25. The seed layer 261 may extend through the second dielectric layer 25 to contact and electrically connect the pad of the first circuit layer 24. A material of the seed layer 261 may be the same as or similar to the material of the seed layer 241 of the first circuit layer 24.

Figure 20:
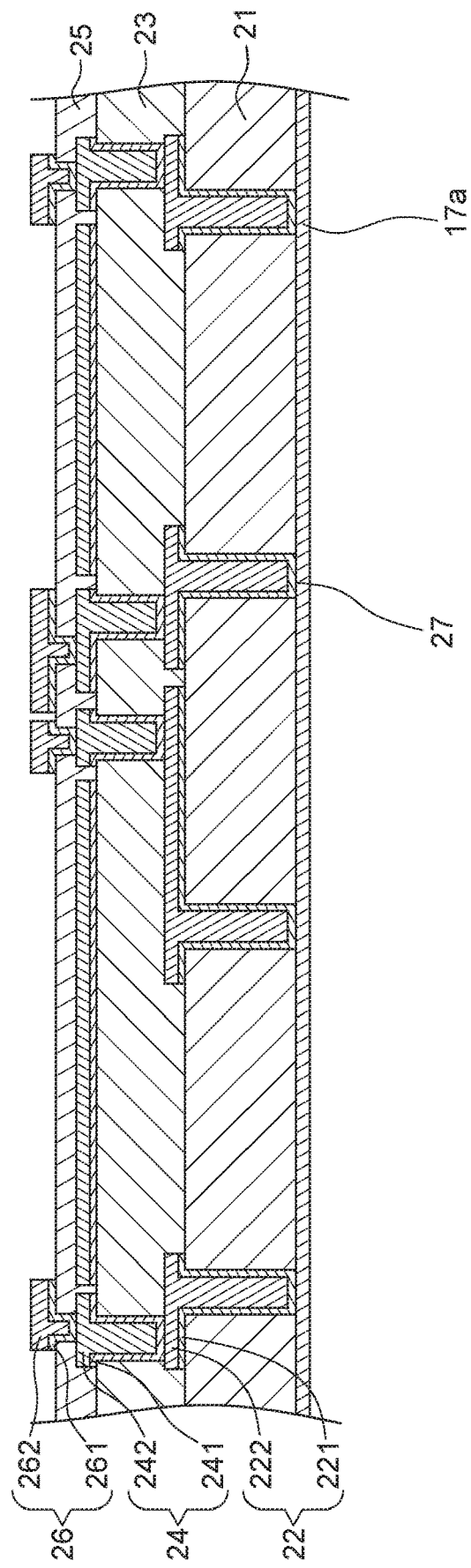
FIG. 20 illustrates one or more stages of an example of a method for manufacturing a semiconductor package structure according to some embodiments of the present disclosure.

Referring to FIG. 20, a conductive layer 262 is formed on the seed layer 261 by, for example, plating. Then, portions of the seed layer not 261 covered by the conductive layer 262 may be removed by, for example, etching, thus forming a second circuit layer 26. The second circuit layer 26 may include at least one conductive via, at least one pad and at least one trace. The conductive via of the second circuit layer 26 may extend through the second dielectric layer 25 to contact and electrically connect the pad of the first circuit layer 24. Processes for forming the second circuit layer 26 may be similar to those for forming the redistribution layer 52 of the third semiconductor die 16.

Figure 21:
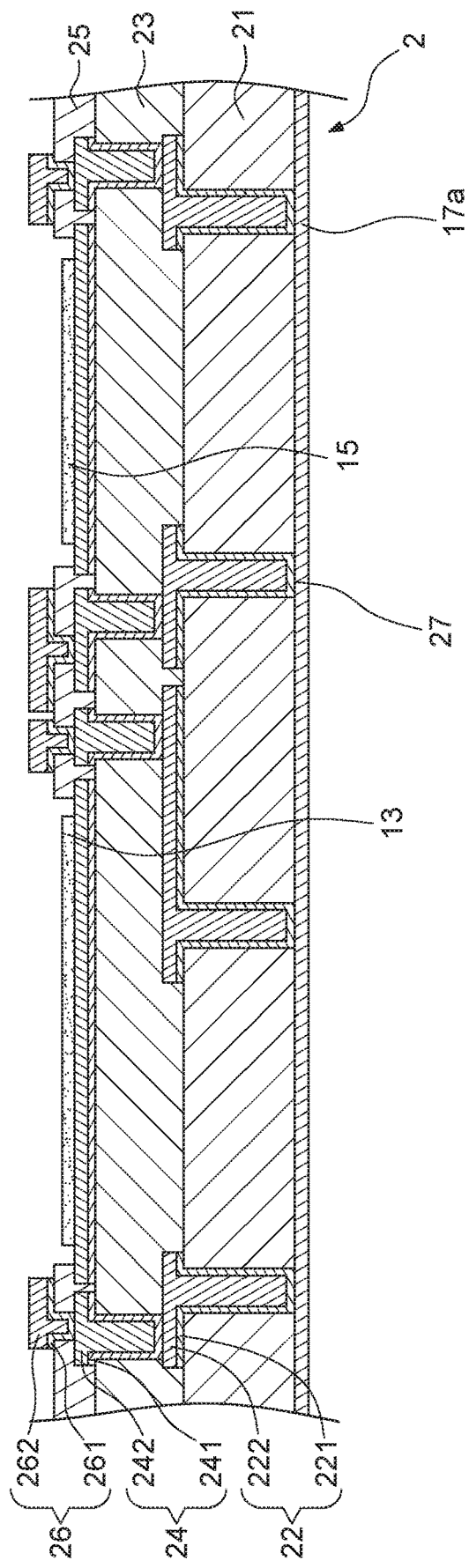
FIG. 21 illustrates one or more stages of an example of a method for manufacturing a semiconductor package structure according to some embodiments of the present disclosure.

Referring to FIG. 21, at least a portion of the second dielectric layer 25 is removed by, for example, laser removing, such that a portion of the first circuit layer 24 is exposed. Accordingly, a wiring structure 2 is formed or provided. The wiring structure 2 includes the lower dielectric layer 21, the lower circuit layer 22, the first dielectric layer 23, the first circuit layer 24, the second dielectric layer 25 and the second circuit layer 26. The wiring structure 2 may have a first side (e.g., top side) and a second side (e.g., bottom side). The first side may be adjacent to the first circuit layer 24, the second dielectric layer 25 and the second circuit layer 26. The second side may be adjacent to the lower dielectric layer 21. The metal layer 17a is disposed adjacent to the second side of the wiring structure 2. Then, a first adhesive layer 13 and a second adhesive layer 15 are disposed on the exposed portion of the first circuit layer 24.

Figure 22:
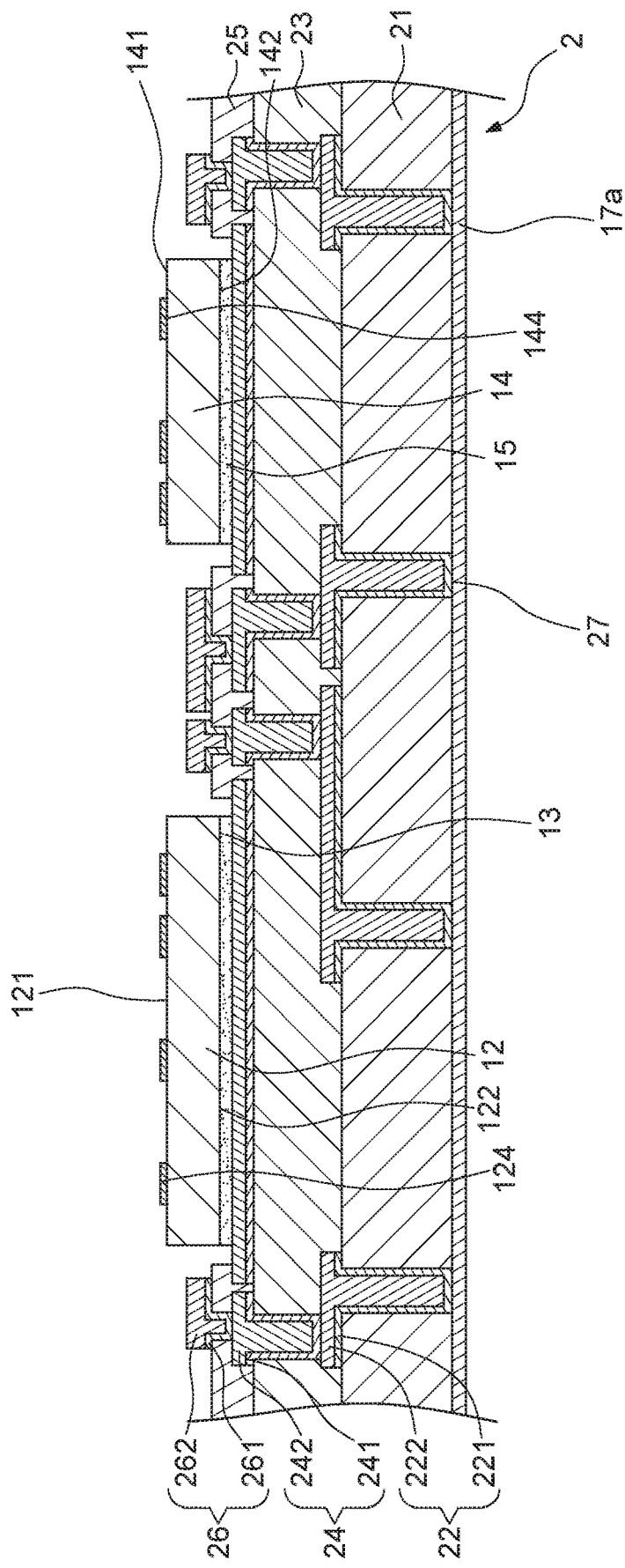
FIG. 22 illustrates one or more stages of an example of a method for manufacturing a semiconductor package structure according to some embodiments of the present disclosure.

Referring to FIG. 22, a first semiconductor die 12 and a second semiconductor die 14 are disposed on and adhered to the wiring structure 2, such as the first side of the wiring structure 2. The second semiconductor die 14 may be disposed adjacent to, or side-by-side with, the first semiconductor die 12. For example, the first semiconductor die 12 and the second semiconductor die 14 may be disposed in the openings of the second dielectric layer 25, thus, the first semiconductor die 12 and the second semiconductor die 14 may be disposed on the exposed portion of the first circuit layer 24. The second circuit layer 26 may be adjacent to, or may surround the first semiconductor die 12 and/or the second semiconductor die 14. In some embodiments, a portion of the second circuit layer 26 may be disposed between the first semiconductor die 12 and the second semiconductor die 14.

In some embodiments, the first semiconductor die 12 may have an active surface 121, and a backside surface 122 opposite to the active surface 121. The first semiconductor die 12 may include at least one first conductive pad 124 disposed on the active surface 121. Similarly, the second semiconductor die 14 may have an active surface 141, and a backside surface 142 opposite to the active surface 141. The second semiconductor die 14 may include at least one second conductive pad 144 disposed on the active surface 141. The backside surface 122 of the first semiconductor die 12 and the backside surface 142 of the second semiconductor die 14 may face the wiring structure 2, and may be adhered to the exposed portion of the first circuit layer 24 by the first adhesive layer 13 and the second adhesive layer 15, respectively.

Figure 23:
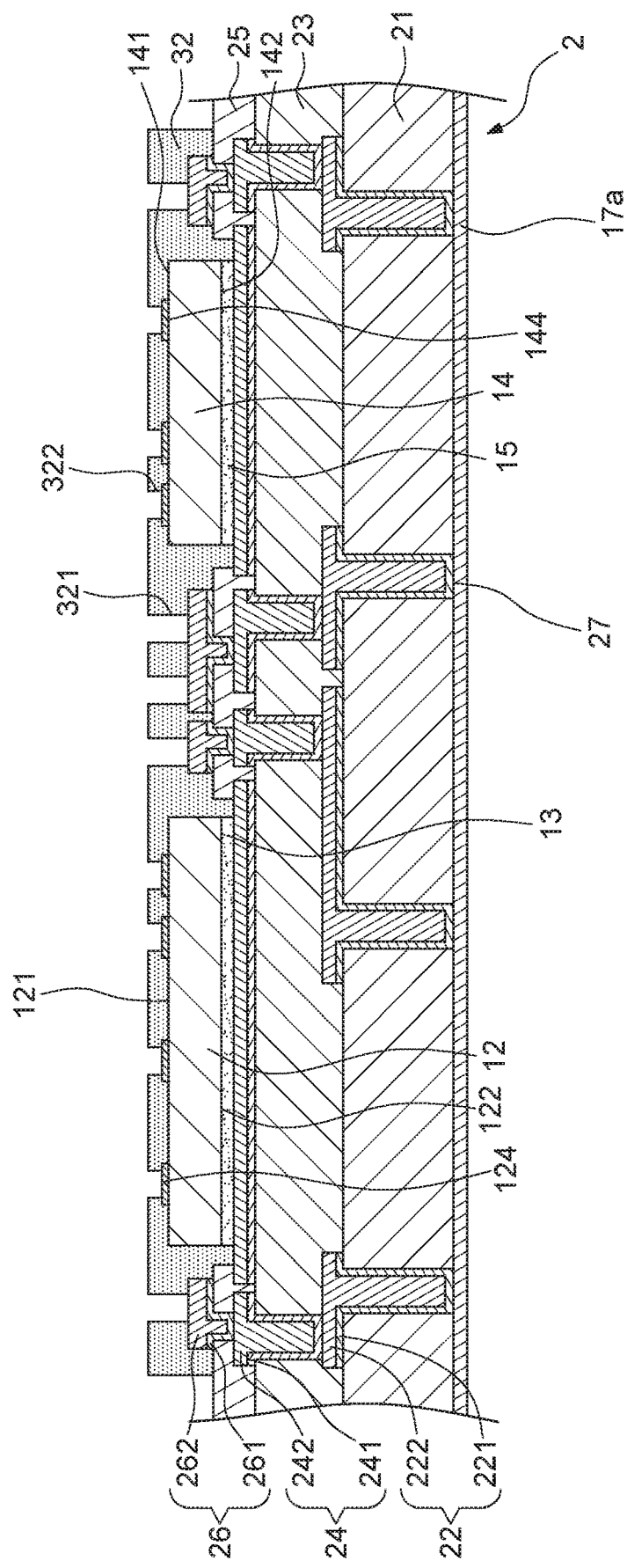
FIG. 23 illustrates one or more stages of an example of a method for manufacturing a semiconductor assembly according to some embodiments of the present disclosure.

Referring to FIG. 23, a first encapsulant 32 is formed or disposed on the wiring structure 2 and cover the first semiconductor die 12 and/or the second semiconductor die 14. The first encapsulant 32 may be disposed on the second dielectric layer 25 and cover the second circuit layer 26. In some embodiments, a portion of the first encapsulant 32 is disposed between the first semiconductor die 12 and the second semiconductor die 14. The first encapsulant 32 may be a dielectric layer, and may define a plurality of openings to expose the first conductive pad 124 of the first semiconductor die 12, the second conductive pad 144 of the second semiconductor die 14 and portions of the second circuit layer 26.

Then, a plurality of first through holes 321 and a plurality of second through holes 322 are formed and extend through the first encapsulant 32 to respectively expose the second circuit layer 26, and the first conductive pad 124 of the first semiconductor die 12 and/or the second conductive pad 144 of the second semiconductor die 14. The first through holes 321 and the second through holes 322 may be formed by mechanical drilling, laser drilling, or lithographic techniques. In some embodiments, the second through holes 322 may be formed by laser drilling since a thickness of the portion of the first encapsulant 32 on the first semiconductor die 12 and the second semiconductor die 14 is relatively small. Thus, a diameter of the second through hole 322 may be relatively small, and a width of a top portion of the second through hole 322 may be substantially equal to a bottom portion of the second through hole 322. As a result, the second through holes 322 may correspond to the high-density first conductive pad 124 of the first semiconductor die 12 and the high-density second conductive pad 144 of the second semiconductor die 14.

Figure 24:
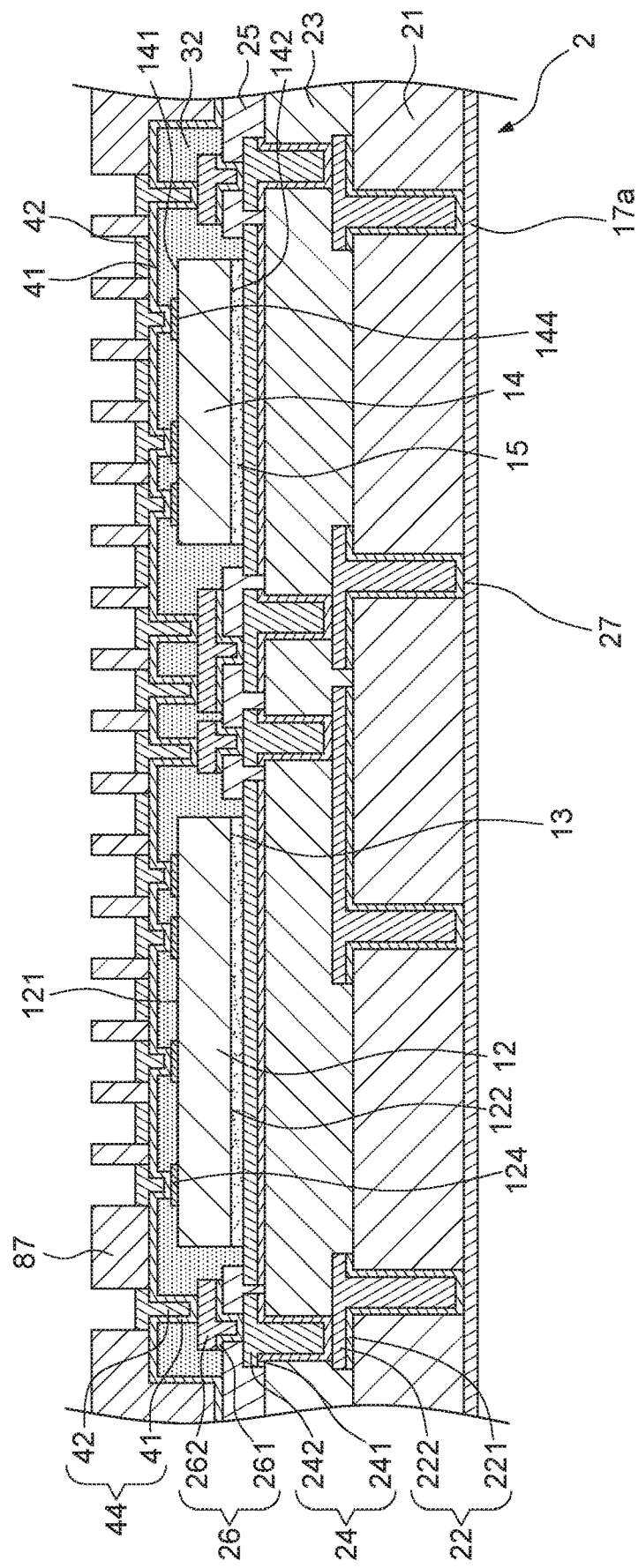
FIG. 24 illustrates one or more stages of an example of a method for manufacturing a semiconductor assembly according to some embodiments of the present disclosure.

Referring to FIG. 24, a seed layer 41 is formed is formed or disposed on the first encapsulant 32 and extends into the first through holes 321 and the second through holes 322 to respectively contact and electrically connect the second circuit layer 26 and the first conductive pad 124 of the first semiconductor die 12 and/or the second conductive pad 144 of the second semiconductor die 14. A material of the seed layer 41 may be the same as or similar to the seed layer 61 of the second pillars 64 and the second redistribution layer 66.

Then, a patterned photoresist 87 is formed or disposed on the seed layer 41 and exposes portions of the seed layer 41. The patterned photoresist 87 may be made of a photoimageable material and may be patterned by exposure and development. Then, a conductive layer 42 is disposed on the exposed portions of the seed layer 41 by, for example, plating. A material of the conductive layer 42 may be the same as or similar to the conductive layer 62 of the second pillars 64 and the second redistribution layer 66.

Figure 25:
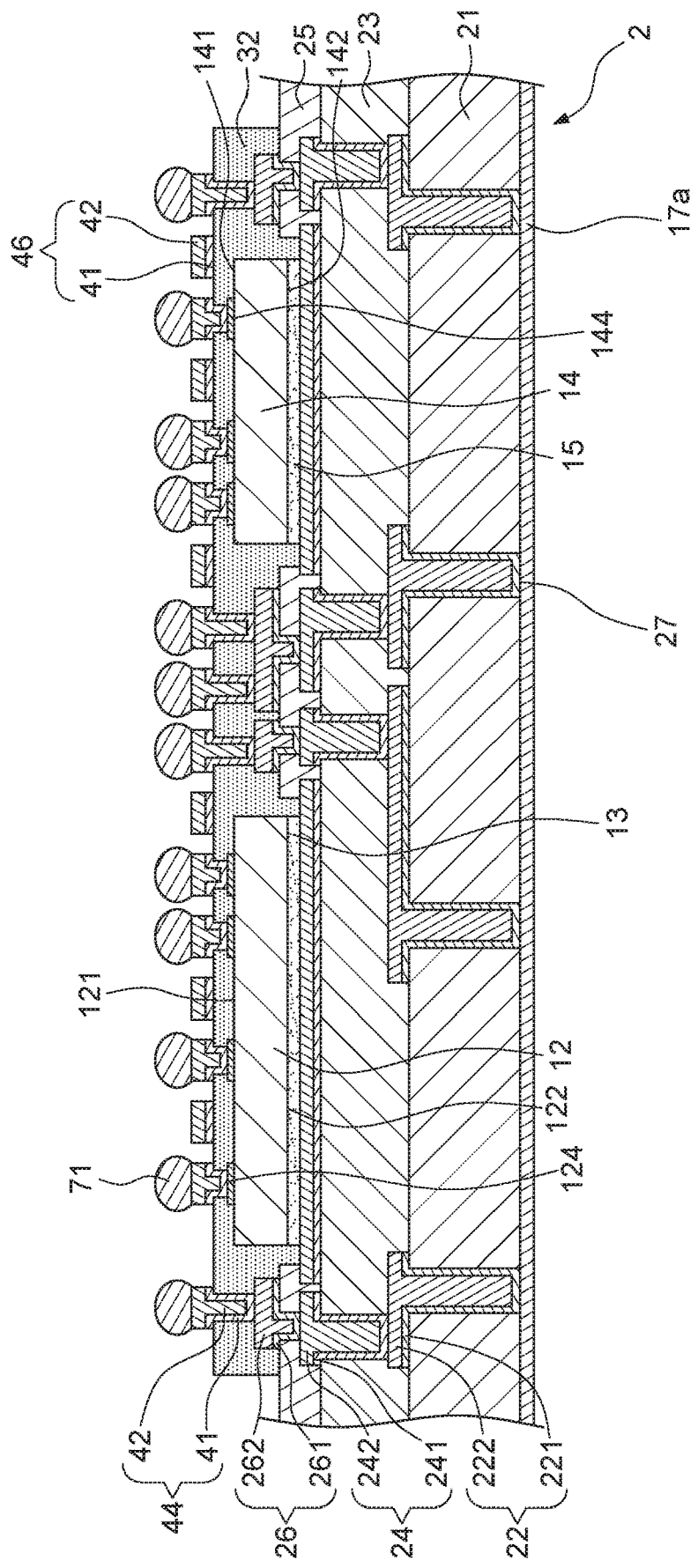
FIG. 25 illustrates one or more stages of an example of a method for manufacturing a semiconductor assembly according to some embodiments of the present disclosure.

Referring to FIG. 25, the patterned photoresist 87 is removed. Then, portions of the seed layer 41 not covered by the conductive layer 42 may be removed by, for example, etching, thus forming a plurality of first pillars 44 and a first redistribution layer 46 integrally and concurrently.

The first pillars 44 are disposed adjacent to, or surrounds, the first semiconductor die 12 and/or the second semiconductor die 14. The first pillars 44 may be disposed in the openings of the first encapsulant 32, and may extend into or extend through the first encapsulant 32 to electrically connect the second circuit layer 26. In some embodiments, at least one of the first pillars 44 is disposed between the first semiconductor die 12 and the second semiconductor die 14. The first pillars 44 are electrically connected to the first circuit layer 24 through the second circuit layer 26. Due to the existence of the second circuit layer 26, a height of the first pillar 44 may be reduced.

The first redistribution layer 46 is disposed on the first encapsulant 32, and is electrically connected to the first semiconductor die 12 and/or the second semiconductor die 14. The first redistribution layer 46 may include at least one trace, at least one pad and at least one via. The via of first redistribution layer 46 may be disposed in the opening of the first encapsulant 32, and may extend into or extend through the first encapsulant 32 to electrically connect the first conductive pad 124 of the first semiconductor die 12 and/or the second conductive pad 144 of the second semiconductor die 14. The first redistribution layer 46 may be formed integrally and concurrently with the first pillars 44. As shown in FIG. 25, the first redistribution layer 46 and the first pillars 44 may include a seed layer 41 and a conductive layer 42. Materials of the seed layer 41 and the conductive layer 42 of the first redistribution layer 46 and the first pillars 44 may be the same as or similar to those of the seed layer 261 and the conductive layer 262 of the second circuit layer 26 of the wiring structure 2.

Then, a plurality of solders 71 is formed or disposed on the first pillars 44 and the first redistribution layer 46.

Figure 26:
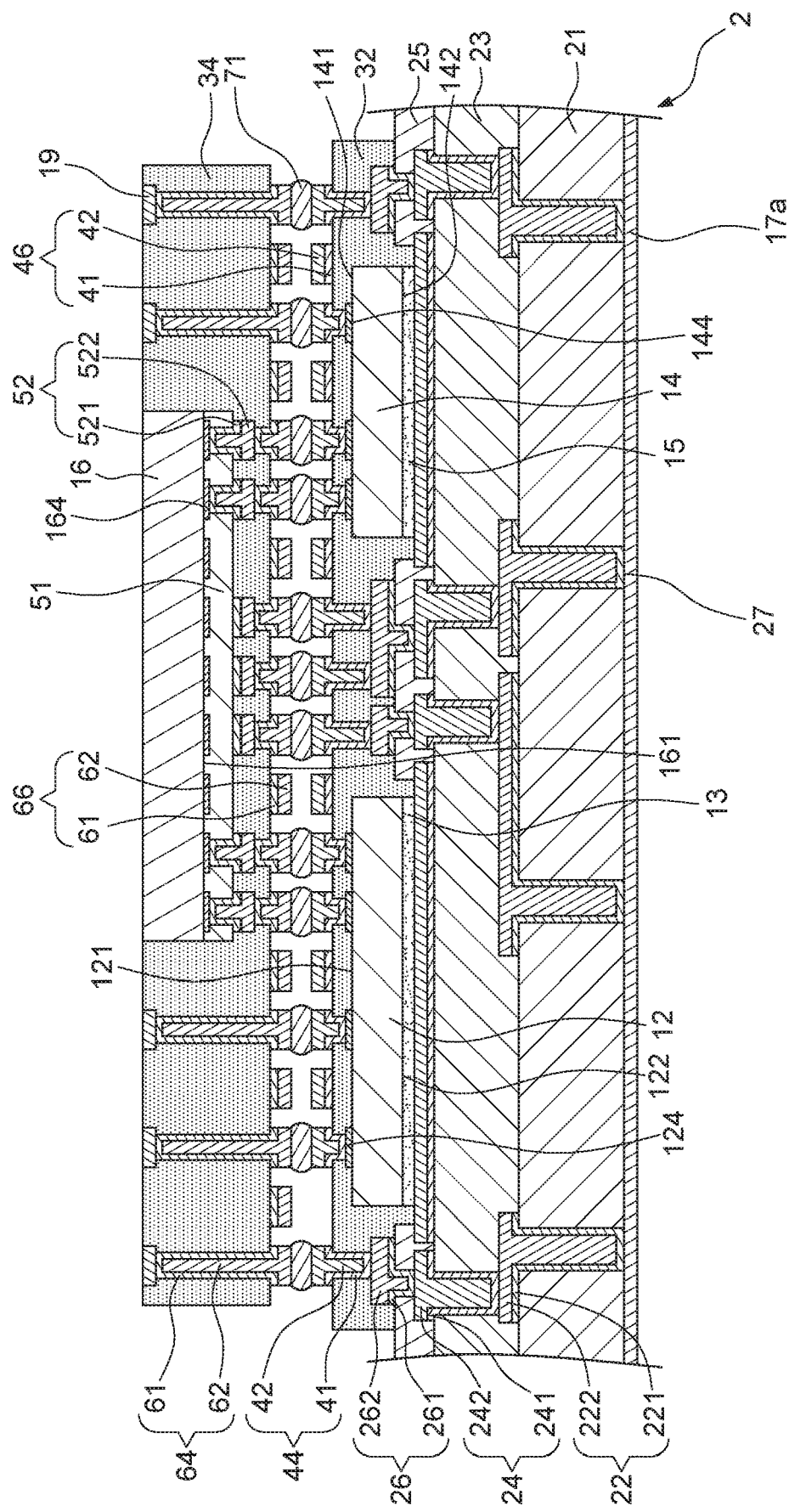
FIG. 26 illustrates one or more stages of an example of a method for manufacturing a semiconductor assembly according to some embodiments of the present disclosure.

Referring to FIG. 26, the structure shown in FIG. 17, including the third semiconductor die 16, the second bump pads 19, the second encapsulant 34, the second pillars 64 and the second redistribution layer 66, is disposed on the first encapsulant 32 and above the first semiconductor die 12 and the second semiconductor die 14. The active surface 161 faces the wiring structure 2, and a portion of the active surface 161 faces a gap between the first semiconductor die 12 and the second semiconductor die 14. Then, a reflow process is conducted to connect the second pillars 64 and the second redistribution layer 66 to the first pillars 44 and the first redistribution layer 46.

At least one of the first pillars 44 may be electrically connected to the third semiconductor die 16, such as through the solders 71 on the second redistribution layer 52. At least one of the second pillars 64 may be electrically connected to the first semiconductor die 12 and/or the second semiconductor die 14, such as through the solders 71 and the first redistribution layer 46. Besides, at least another one of the second pillars 64 may be connected to at least another one of the first pillars 44.

The second redistribution layer 66 may be electrically connected to the first redistribution layer 46 through the solder 71, such that two ends of the third semiconductor die 16 electrically connects the first semiconductor die 12 and the second semiconductor die 14 respectively.

A portion of the third semiconductor die 16 may be electrically connected to the wiring structure 2 directly without through the first semiconductor die 12 and the second semiconductor die 14. For example, the external contact 27 may be electrically connected to the third semiconductor die 16 through the wiring structure 2, the first pillars 44, the solders 71, the second redistribution layer 66 and the redistribution layer 52 of the sub-micro circuit structure. An electrical path (or a signal transmitting path) between the third semiconductor die 16 and the external contact 27 may extend through a space between the first semiconductor die 12 and the second semiconductor die 14. In some embodiments, the electrical path (or the signal transmitting path) may include at least one of the first pillars 44 disposed between the first semiconductor die 12 and the second semiconductor die 14. In some embodiments, the electrical path (or the signal transmitting path) may further include at least a portion of the second circuit layer 26 disposed between the first semiconductor die 12 and the second semiconductor die 14, which is disposed under the first pillars 44. Due to the arrangement of the electrical path (or the signal transmitting path), some electrical signal (e.g., power signal, ground signal and/or data signal) from one of the first semiconductor die 12 and the second semiconductor die 14 may be transmitted to the external contact 27 through the third semiconductor die 16, the first pillars 44 and the wiring structure 2 without passing through another one of the first semiconductor die 12 and the second semiconductor die 14. Accordingly, the electrical path (or the signal transmitting path) may be sufficiently shortened. Such a short electrical path (or signal transmitting path) may improve the signal intensity and signal integrity.

Figure 27:
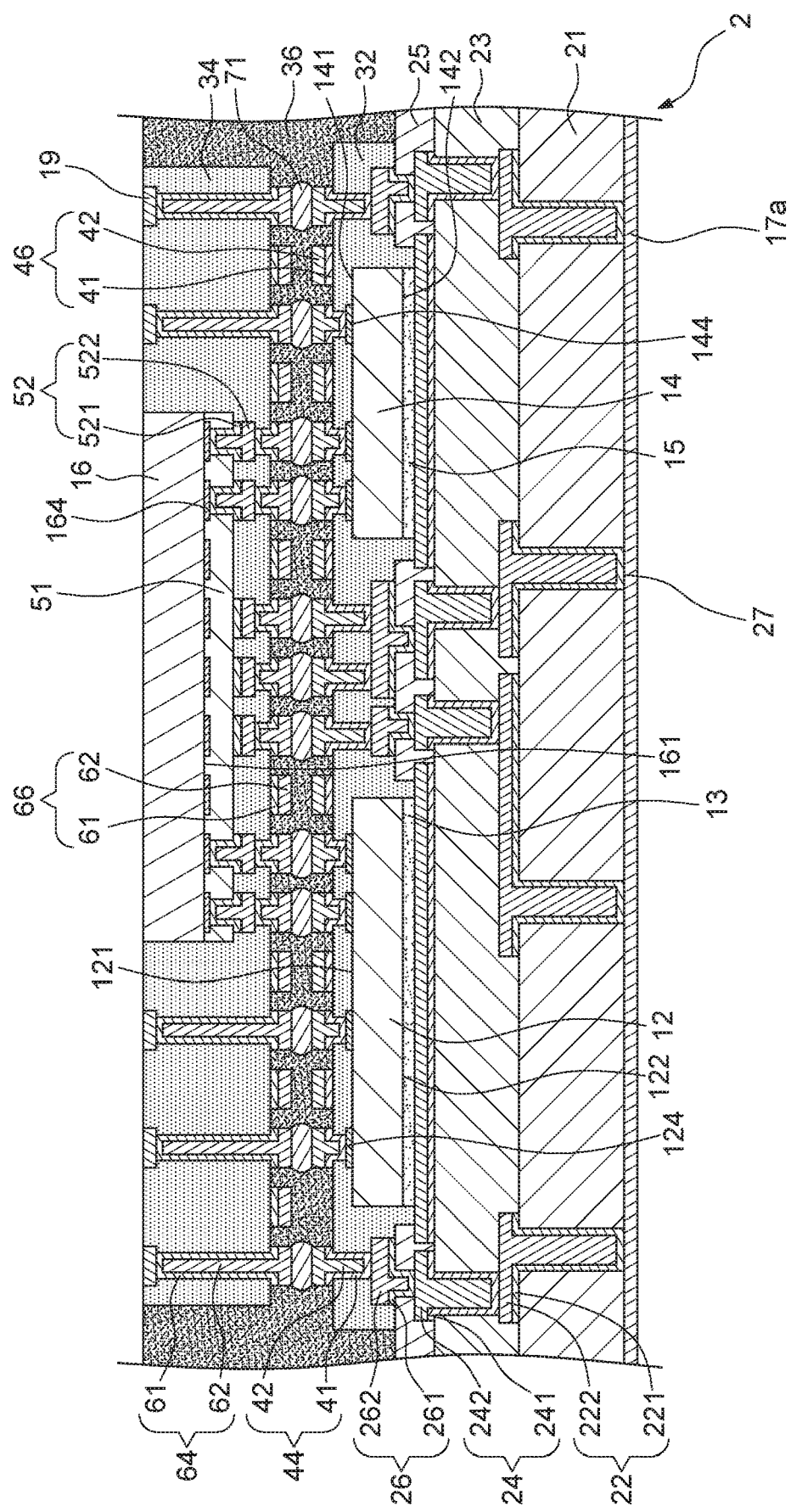
FIG. 27 illustrates one or more stages of an example of a method for manufacturing a semiconductor assembly according to some embodiments of the present disclosure.

Referring to FIG. 27, a third encapsulant 36 is disposed between and covers the first encapsulant 32 and the second encapsulant 34. The encapsulant 36 may cover and contact the first redistribution layer 46, the second redistribution layer 66 and the solders 71.

Figure 28:
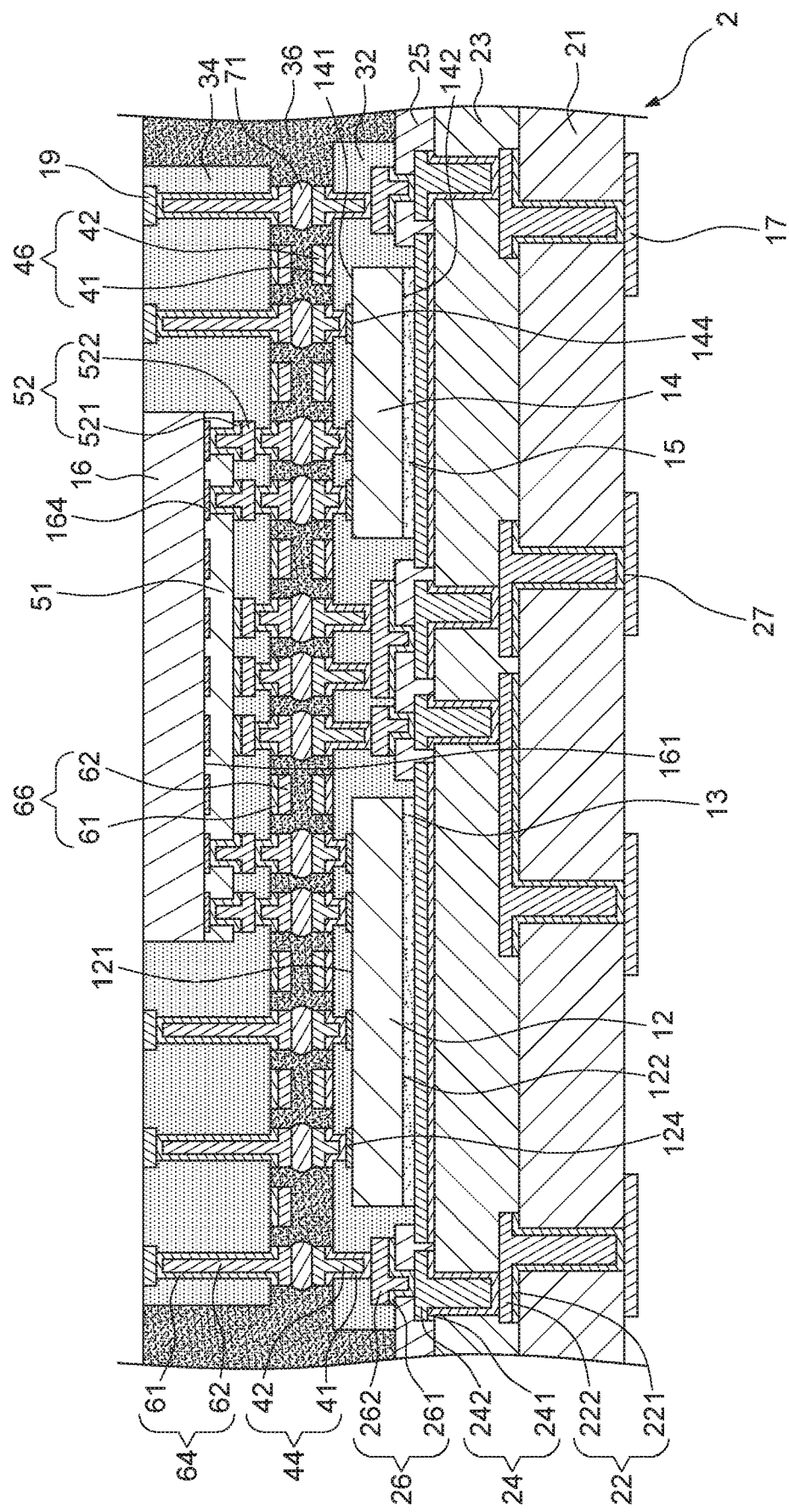
FIG. 28 illustrates one or more stages of an example of a method for manufacturing a semiconductor assembly according to some embodiments of the present disclosure.

Referring to FIG. 28, portions of the metal layer 17a may be removed by, for example, etching, thus forming a first bump pad 17. The first bump pad 17 is disposed on the wiring structure 2 and electrically connected to the external contact 27.

Figure 29:
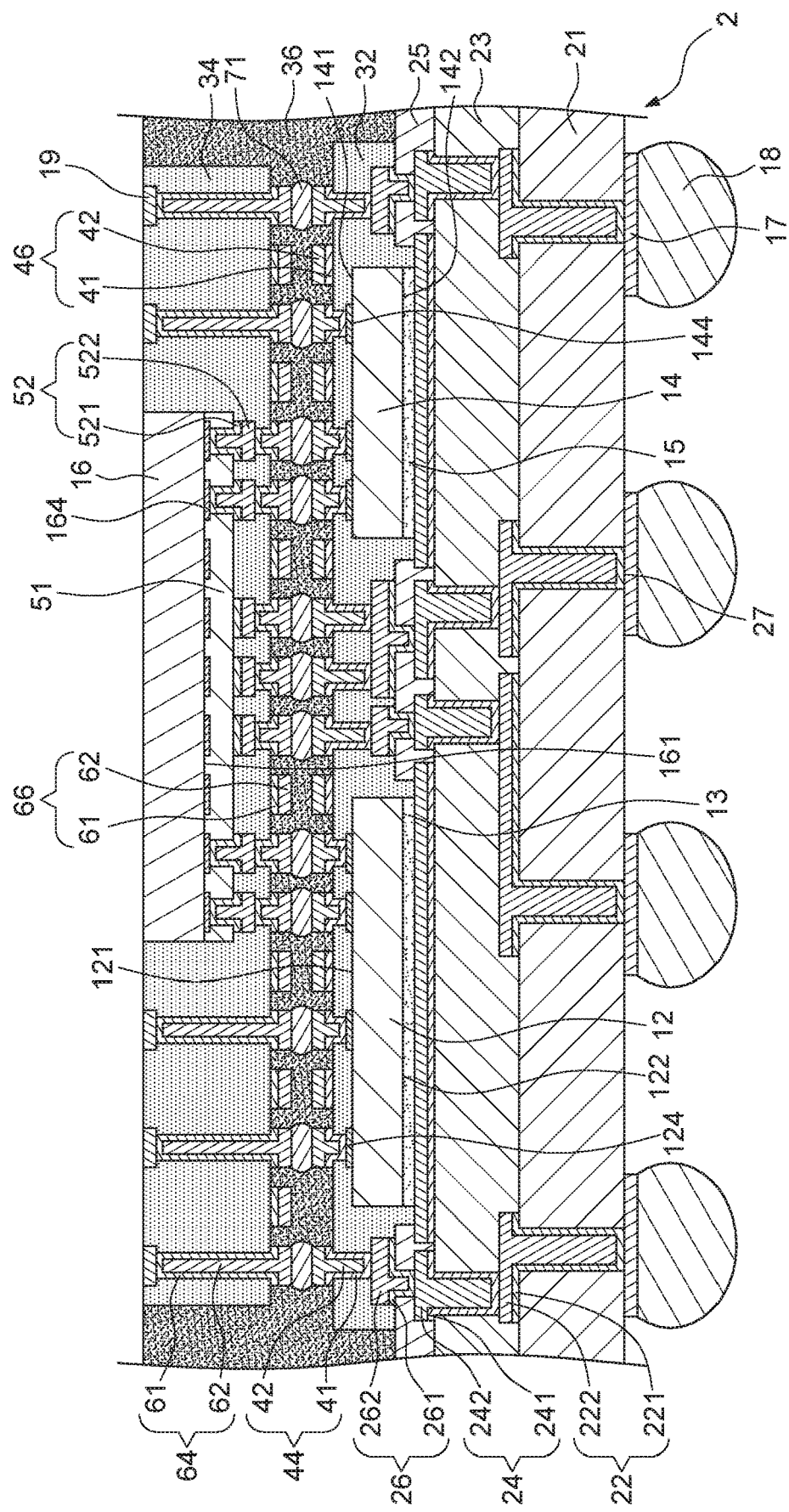
FIG. 29 illustrates one or more stages of an example of a method for manufacturing a semiconductor assembly according to some embodiments of the present disclosure.

Referring to FIG. 29, an external connector 18 is disposed on the first bump pad 17 for external connection purpose. Then, the third encapsulant 36 and the wiring structure 2 may be singulated, thus forming a semiconductor package structure, such as the semiconductor package structure 1 as shown in FIG. 1.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
   a first semiconductor die;
   a second semiconductor die disposed adjacent to the first semiconductor die;
   a third semiconductor die electrically connecting the first semiconductor die and the second semiconductor die;
   a plurality of first pillars disposed adjacent to the first semiconductor die and/or the second semiconductor die;
   a plurality of second pillars disposed adjacent to the third semiconductor die, wherein a pillar space between the plurality of first pillars is less than a pillar space between the plurality of second pillars; and
   an external contact electrically connected to the third semiconductor die, wherein an electrical path between the third semiconductor die and the external contact extends through a space between the first semiconductor die and the second semiconductor die.

2. The semiconductor package structure of claim 1, wherein a maximum length of the plurality of first pillars is less than a maximum length of the plurality of second pillars.

3. The semiconductor package structure of claim 1, wherein the electrical path between the third semiconductor die and the external contact includes at least one of the plurality of first pillars.

4. The semiconductor package structure of claim 1, further comprising a wiring structure, wherein the first semiconductor die and the second semiconductor die are disposed between the third semiconductor die and the wiring structure.

5. The semiconductor package structure of claim 4, wherein the wiring structure includes a first circuit layer and a second circuit layer, the first semiconductor die and the second semiconductor die are disposed on the first circuit layer, and the second circuit layer is disposed on the first circuit layer and adjacent to the first semiconductor die and/or the second semiconductor die.

6. The semiconductor package structure of claim 5, wherein the electrical path between the third semiconductor die and the external contact includes at least a portion of the second circuit layer disposed between the first semiconductor die and the second semiconductor die.

7. The semiconductor package structure of claim 5, further comprising a first encapsulant disposed on the wiring structure and covering the first semiconductor die and/or the second semiconductor die, and the plurality of first pillars extend into the first encapsulant to electrically connect the wiring structure.

8. The semiconductor package structure of claim 7, further comprising a first redistribution layer disposed on the first encapsulant and electrically connected to the first semiconductor die and/or the second semiconductor die, wherein the first redistribution layer is formed integrally and concurrently with the plurality of first pillars.

9. The semiconductor package structure of claim 7, wherein a portion of the first encapsulant is disposed between the first semiconductor die and the second semiconductor die.

10. The semiconductor package structure of claim 9, wherein the electrical path between the third semiconductor die and the external contact extends through the portion of the first encapsulant disposed between the first semiconductor die and the second semiconductor die.

11. The semiconductor package structure of claim 1, further comprising a second encapsulant covering the third semiconductor die, and the plurality of second pillars extend into the second encapsulant.

12. The semiconductor package structure of claim 11, further comprising a second redistribution layer disposed on the second encapsulant and electrically connected to the third semiconductor die, wherein the second redistribution layer is formed integrally and concurrently with the plurality of second pillars.

13. The semiconductor package structure of claim 1, further comprising:

a first encapsulant disposed on a wiring structure and covering the first semiconductor die and/or the second semiconductor die, wherein the plurality of first pillars extend into the first encapsulant;

a second encapsulant covering the third semiconductor die, wherein the plurality of second pillars extend into the second encapsulant; and a third encapsulant disposed between and covering the first encapsulant and the second encapsulant.

14. A semiconductor package structure, comprising:

a first semiconductor die;

a second semiconductor die disposed adjacent to the first semiconductor die;

a third semiconductor die electrically connecting the first semiconductor die and the second semiconductor die;

a first encapsulant covering the first semiconductor die and/or the second semiconductor die, wherein a portion of the first encapsulant is disposed between the first semiconductor die and the second semiconductor die;

a second encapsulant covering the third semiconductor die, and a width of the second encapsulant is greater than a width of the third semiconductor die;

a third encapsulant disposed between and covering the first encapsulant and the second encapsulant; and an external contact electrically connected to the third semiconductor die, wherein the first semiconductor die and the second semiconductor die are disposed between the third semiconductor die and the external contact.

15. The semiconductor package structure of claim 14, wherein the second encapsulant includes a first portion disposed on the third semiconductor die, and a second portion surrounding the third semiconductor die, and a thickness of the first portion is less than a thickness of the second portion.

* * * * *